United States Patent
Libatique et al.

(10) Patent No.: US 6,570,893 B1
(45) Date of Patent: May 27, 2003

(54) PRECISELY WAVELENGTH-TUNABLE AND WAVELENGTH-SWITCHABLE NARROW LINEWIDTH LASERS

(75) Inventors: Nathaniel C. Libatique, Albuquerque, NM (US); Ravinder K. Jain, Albuquerque, NM (US)

(73) Assignee: Science & Technology Corporation @ UNM, Albuquerque, NM (US)

( * ) Notice: Subject to any disclaimer, the term of this patent is extended or adjusted under 35 U.S.C. 154(b) by 0 days.

(21) Appl. No.: 09/448,869

(22) Filed: Nov. 24, 1999

Related U.S. Application Data

(60) Provisional application No. 60/110,056, filed on Nov. 25, 1998.

(51) Int. Cl.[7] .................................................. H01S 3/10
(52) U.S. Cl. ............................. 372/20; 372/98; 372/92; 372/64
(58) Field of Search ......................... 372/98, 64, 6, 372/99, 92, 20, 32

(56) References Cited

U.S. PATENT DOCUMENTS

| | | | |
|---|---|---|---|
| 4,979,178 A | 12/1990 | Beausoleil et al. | |
| 5,132,976 A | 7/1992 | Chung et al. | |
| 5,317,576 A | 5/1994 | Leonberger et al. | |
| 5,425,039 A | * 6/1995 | Hsu et al. ............... | 372/6 |
| 5,504,771 A | 4/1996 | Vahala et al. | |
| 5,541,945 A | 7/1996 | Yamaguchi et al. | |
| 5,771,252 A | 6/1998 | Lang et al. | |
| 5,771,253 A | 6/1998 | Chang-Hasnain et al. | |
| 5,812,567 A | 9/1998 | Jeon et al. | |
| 5,828,681 A | 10/1998 | Epworth | |
| 5,862,162 A | 1/1999 | Maeda | |

OTHER PUBLICATIONS

Libatique et al, "Precisely and rapidly wavelemgth–switchable narrow–linewidth 1.5 m Laser source for wavelength division multiplexing applications", IEEE Photonics Technology Nov. 1999.*

Libatique et al., "Precisely and rapidly wavelength–switchable narrow–linewidth 1.5 $\mu$m laser source for wavelength division multiplexing applications," *IEEE Photonics Technology*, Nov., 1999.

Libatique et al., "Novel wavelength–modulatable and continuously tunable narrow–linewidth fiber lasers for trace gas spectroscopy," presented at CLEO 1999 in Baltimore.

* cited by examiner

*Primary Examiner*—Leon Scott, Jr.
(74) *Attorney, Agent, or Firm*—Jagtiani + Guttag

(57) ABSTRACT

Continuously tunable and precisely wavelength-switchable fiber lasers combine fiber Bragg gratings and the transmissive filtering properties of high finesse fiber Fabry-Perot filters. This laser arrangement adapts to multiple wavelength ranges based on the selections of fiber Bragg grating and gain medium and their arrangement to create a wavelength-modulatable and simultaneously rapidly wavelength-switchable narrow linewidth all-fiber laser design. This laser arrangement further results in narrow-linewidth outputs with fast switching speeds between the selected wavelengths.

49 Claims, 17 Drawing Sheets

PRECISELY WAVELENGTH-TUNABLE AND WAVELENGTH-SWITCHABLE NARROW LINEWIDTH LASERS

CROSS-REFERENCE TO RELATED APPLICATIONS

This application makes reference to co-pending U.S. Provisional Patent Application No. 60/110,056, entitled "Novel Wavelength-Modulatable and Continuously Tunable Narrow-Linewidth Fiber Lasers and Precisely Wavelength-Switchable Narrow-Linewidth Laser for Optical Telecommunications and Spectroscopic Applications," filed Nov. 25, 1998, and U.S. patent application Ser. No. 09/246,125, entitled "Tunable Bragg Gratings and Devices Employing the Same," filed Feb. 8, 1999, the entire contents and disclosures of which are hereby incorporated by reference.

BACKGROUND OF THE INVENTION

1. Field of the Invention

The present invention relates generally to tunable fiber lasers.

This invention is made with government support under contract numbers MDA-972-94-1-0003 and MDA-972-98-1-0002, awarded by DARPA. The government may have certain rights in this invention.

2. Description of the Prior Art

Tunable lasers have applications in a wide variety of fields, including optical communications and spectroscopy. For trace gas monitoring, compact tunable (20–30 GHz), wavelength modulatable sources with output powers on the order of approximately 100 $\mu$W and linewidths better than 100 MHz are in great demand for wavelength modulation spectroscopy. The availability of high performance erbium-doped fiber amplifiers and pumped lasers allows for tunable fiber lasers. Modulation and switching of optical signals are basic functions in an optical communication system. Through modulation, the information to be communicated is expressed in one or more parameters of a light signal, such as the amplitude, the polarization, the phase or frequency of the field, or of the magnitude or spatial distribution of the power and/or intensity. Through switching, the light signal may be routed through a network of optical nodes and connections.

Precisely wavelength-switchable narrow linewidth laser sources are of great interest for many photonic applications, such as for tuning "on and off" narrow absorption lines in spectroscopic measurements, including the monitoring of resonantly absorbing species in DIAL (differential absorption LIDAR)-type applications. Wavelength-switchable narrow linewidth laser sources are also critically needed for several applications in WDM-based (wavelength division multiplexed) fiber optic communication systems. Key requirements for such multi-wavelength switchable sources for WDM/DWDM systems are: (1) an accurate match with the wavelength channels on the WDM/DWDM ITU grid, (2) an arbitrary set of such channels, (3) a capability for switching reliably to any channel between such a pre-selected arbitrary set of channels, (4) low crosstalk, and (5) microsecond (or faster) switching speeds.

Past multi-wavelength switchable sources have in general been limited to schemes that are either difficult to scale to a large number of wavelengths, or have relatively slow (millisecond) switching speeds. Laser arrangements such as those found in U.S. Pat. No. 5,504,771 also require the use of stable external "wavelength lockers" to prevent wavelength drift from the FFPs PZT tuning assembly. Multi-frequency lasers based on integrated-optic arrays of DBR and DFB lasers, or SOA (semiconductor optical amplifiers arrays integrated with AWGs (arrayed waveguide gratings) seem to satisfy most of the above requirements. However, these are relatively difficult and expensive to manufacture, particularly in small volumes or for custom applications that may require a combination of numerous arbitrarily-spaced channels on the WDM/DWDM ITU grid.

Therefore, there is still a need for a rapidly switchable multi-wavelength source that is relatively easy to manufacture for any customized set of arbitrary channels on the ITU grid.

SUMMARY OF THE INVENTION

It is therefore an object of the present invention to provide a rapidly switchable multi-wavelength source that is relatively easy to manufacture for any customized set of arbitrary channels.

It is a further object to provide precise wavelength switching and selectivity capable of achieving specifications needed for DWDM applications.

It is yet another object to provide continuously wavelength-tunable fiber lasers and rapidly and precisely wavelength-switchable fiber lasers.

It is yet another object to provide continuous wave output as well as pulsed laser source designs.

It is yet another object to provide for single-wavelength and multi-wavelength switchable and tunable emission.

It is yet another object to prevent wavelength drift from the FFPs PZT tuning assembly by providing stable wavelength intra-cavity filters through the use of fixed-wavelength fiber Bragg gratings.

It is yet another object to provide wavelength-modulatable and simultaneously rapidly wavelength-switchable narrow linewidth all-fiber laser design for ultra-sensitive detection of single or multiple trace gas species.

It is yet another object to provide fine electronic tuning over a coarsely selected wavelength range.

It is yet another object to provide narrow linewidth outputs, superior power outputs, and lower RIN (relative intensity noise) than elaborate short cavity lasers.

BRIEF DESCRIPTION OF THE DRAWINGS

The invention will be described in conjunction with the accompanying drawings, in which.

DETAILED DESCRIPTION OF THE PREFERRED EMBODIMENT

Figure 1A:
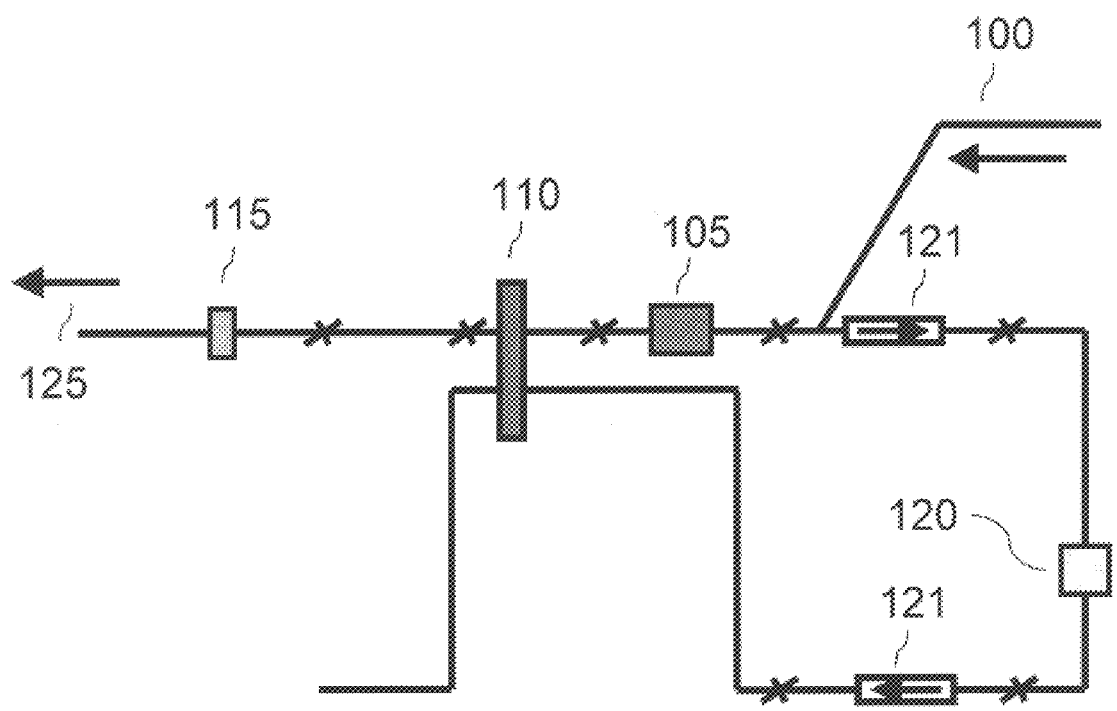
FIG. 1A is a schematic diagram of a Sagnac loop travelling wave laser.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated otherwise.

The term "laser cavity resonator" for the purposes of the present invention refers to the device having a round trip path for the optical field of the laser. This propagation of the optical field in the roundtrip path may be facilitated by various means which include, but are not limited to, fiber-optic waveguides, planar waveguides in bulk glass, planar waveguides in semiconductors, as well as free space (i.e. open cavity resonators in MEMS-based designs).

The term "Bragg grating" or "fiber Bragg grating (FBG)", for the purposes of the present invention, refers to a structure containing alternating periodic segment arms of varying periods of high and low refractive index material segment arms and/or appropriately embedded phase shift segment arms at well defined locations of the structure. A "period" for the purposes of the present invention is defined as one set of adjacent high and low refractive material segment arms. It is understood by this definition that the order of the high and low index materials is irrelevant, only that there is a change in refractive index between adjacent segment arms. While only uniform gratings are illustrated below, non-uniform gratings are also contemplated within the scope of the invention.

The term "waveguide" for the purposes of the present invention refers to any device used to channel an optical signal, at any frequency. Specific examples of waveguides include, but are not limited to: fiber-optic waveguides, planar glass, as well as crystalline and semiconductor waveguides.

The term "input voltage" for the purposes of the present invention refers to any voltage that is applied to the devices discussed below. In particular embodiments, specific voltages are used. Examples of these voltages include, but are not limited to: a DC voltage, an AC voltage, and pulsed voltage.

The term "ITU grid" for the purposes of the present invention refers to a standard grid of WDM channels: discrete set of pre-designated wavelengths that are: (1) used as optical carriers of information (i.e., wavelength channels separated by 100 GHz in the ITU DWDM grid), or (2) used as signals for the control, generation, routing, and supervision of the above-mentioned optical carrier wavelength channels. The relationship between $wavelength_{carrier}$ and $wavelength_{control}$ is illustrated in the case of wavelength conversion through FWM (four wave mixing) in semiconductor optical amplifiers. In this example, the pump wavelengths are the control wavelengths i.e., $wavelength_{pump}$, while the source and target wavelengths are the carrier wavelengths, i.e., $wavelength_{carrier}$.

The term "multiwavelenght grid filter" for the purpose of the present invention refers to a set of wavelengths that are equally spaced or whose spacing are multiples of a common interval. The device sets up a pre-designated set of wavelength channels. Examples of such pre-designated sets include, but are not limited to, the 50 and 100 GHz WDM wavelength standards defined by the ITU, and strong near-infrared (1.5 um spectral region) absorption lines of chosen molecules. The device may have single or multiple wavelength passbands. The device may be composed of a single optical filter or a set of such optical filters. Specific examples of multi-wavelength grid filters include but are not limited to: Reflective Waveguide Bragg Gratings (WBGs) such as FBGs (Fiber Bragg Gratings), and SFBGs (Sampled Fiber Bragg Gratings); Transmissive WBGs such as phase-shifted FBGs (with single or multiple passbands); PZT-based FFP (fiber Fabry-Perot) filters; LCD-based FFP (fiber Fabry-Perot) filters; Microelectromechanical system (MEMS)-based FP (Fabry-Perot) filters; Electro-optic FP filters (i.e., LCD-based, poled glass, poled crystals); Micro-ring resonators; Grating-assisted waveguide couplers; Electro-optic waveguide coupler; MI (Michelson Interferometer)

waveguide-based filter; MZI (Mach-Zehnder Interferometer) waveguide-based filter; and Arrayed Waveguide Gratings (AWGs), etc.

The term "rapidly wavelength-tunable filter" for the purpose of the present invention refers to a device that provides the means for rapid (<50 µs) tuning of the optical filter passband across the spectral range of interest. The means include but are not limited to: thermal or strain tuning, electro-optic tuning, and electro-absorptive modulation. The device may have single or multiple wavelength passbands. The device may be composed of a single optical filter or a set of such optical filters. Specific examples of rapidly wavelength-tunable filters include but are not limited to: Reflective Waveguide Bragg Gratings (WBGs) such as tunable FBGs (Fiber Bragg Gratings), and tunable SFBGs (Sampled Fiber Bragg Gratings); Transmissive WBGs such as phase-shifted tunable FBGs (with single or multiple passbands); PZT-based FFP (fiber Fabry-Perot) filters; LCD-based FFP (fiber Fabry-Perot) filters; Microelectromechanical system (MEMS)-based FP (Fabry-Perot) filters; Electro-optic FP filters (i.e. LCD-based, poled glass, poled crystals); Micro-ring resonators (i.e. poled glass, electro-absorptive material); Grating-assisted tunable waveguide couplers; Electro-optic waveguide coupler; Tunable Michelson interferometer (MI) waveguide-based filter; Tunable MZI (Mach-Zehnder Interferometer) waveguide-based filter; and Tunable AWGs, etc.

The term "optical feedback coupling device" for the purpose of the present invention refers to a device for combining the optical feedback from transmissive and reflective filters in the same laser resonator cavity. Specific examples of such devices include, but are not limited to, N-port optical circulators (N=3, 4, etc.), fused fiber couplers, and waveguide-Y junctions, etc.

The term "gain medium" for the purpose of the present invention refers to a medium that provides gain to the optical signal. Examples of such mediums include, but are not limited to doped fiber optic waveguides or semiconductor optical amplifiers.

The term "pump source" for the purposes of the present invention refers to an optical or electrical tunable or switchable emission.

The term "wavelength comb" for the purposes of the present invention refers to refers to a set of wavelengths that are equally spaced or whose spacing are multiples of a common interval.

Description

Before the preferred embodiments are described, we will first discuss the invention in a general fashion. It should be appreciated that there are two distinct embodiments of the invention. The first embodiment addresses precisely wavelength switchable narrow linewidth lasers. This first embodiment is mainly used in WDM telecommunication systems. The second embodiment addresses precisely wavelength tunable narrow linewidth lasers. This second embodiment is mainly used for tuning "on and off" narrow absorption lines in spectroscopic measurements, including the monitoring of resonantly absorbing species in DIAL (differential absorption LIDAR)-type applications.

In the precisely wavelength switchable narrow linewidth laser embodiment, the design is based on two narrow band filters: (1) a stable multi-wavelength filter where each selected wavelength is precisely matched to a standard grid of WDM channels, and (2) a rapidly (<50 µs) wavelength-tunable filter. In the 1.5 um telecommunications spectral region, both narrow linewidth filters should have bandwidths of at least 5 GHz (preferably <1 GHz). These bandwidths are determined by the precision required of each channel in the standard grid of WDM channels. This laser source can have single- or multiple-wavelength rapidly wavelength-switchable emission in the channels specified by the multi-wavelength grid filter.

In the precisely wavelength tunable narrow linewidth laser embodiment, the device is based on two filters: (1) a stable multi-wavelength filter where each selected wavelength is precisely matched to a pre-designated set of wavelength channels (such as that which coincides with significant absorption peaks of chosen molecular species), and (2) a rapidly wavelength-tunable filter. The multi-wavelength filter should have individual wavelength channels that have bandwidths that are at least as broad as the tuning range desired (i.e. bandwidth of molecular absorption feature). The rapidly wavelength-tunable filter should have a bandwidth that is at least 10 times (preferably<20 times) narrower than the bandwidth of the above-mentioned absorption feature. In the spectroscopy applications for the 1.5 um near-infrared spectral region, the significant molecular absorption features are normally 10–30 GHz wide, so the multi-wavelength filter wavelength channels should have a bandwidth that is at least as wide (10–30 GHz), while the rapidly tunable wavelength filter should have a bandwidth less than 1 GHz (preferably<100 MHz). This laser source can have single- or multiple-wavelength rapidly wavelength-tunable emission in the wavelength channels specified by the multi-wavelength grid filter.

In either embodiment, the laser resonator can be wholly or in part of ring, or linear geometry. A pump source provides energy for the gain medium and a means for coupling this energy to the gain medium is provided. The gain medium may be a doped fiber optic waveguide or a semiconductor optical amplifier. The optical field in the laser resonator has a roundtrip path that is facilitated in part or wholly by various media which include, but are not limited to: optical fiber, planar waveguides in bulk glass, planar waveguides in semiconductors, as well as free space open cavity resonators in MEMS-based designs.

In a ring geometry, transmissive filters may be directly inserted in the roundtrip path. In the linear geometry, reflective filters can be directly inserted in both ends of the cavity roundtrip path. In a cavity which is part linear and part ring, the means to couple the feedback from both filters is provided by the optical feedback coupling device. An example of such a device is a 3-port circulator which transforms a reflective FBG into a transmissive filter.

The multi-wavelength filter is stabilized through an ultra-stable compensation means that is usually accomplished through a reference wavelength wavelength$_{ref}$ which is locked to a frequency standard. This reference wavelength (s) wavelength$_{ref}$ is a subset of the pre-designated multi-wavelength grid. The multi-wavelength filter may be a set of discrete filters or a single filter.

The tunable wavelength filter may be a set of discrete filters or a single tunable filter. The means for rapid tuning of wavelength-tunable filter is provided.

The source design of the invention as shown, for example, in FIG. 1, uses a dual filter approach comprising a filter composed of a set of fiber Bragg gratings (FBGs) that generates a wavelength comb corresponding to the ITU grid, and a second tunable filter composed of a fiber Fabry-Perot (FFP-TF) that selects the desired wavelength channel. A precise and stable single or multi-frequency grid is set up by filters (usually by reflective narrow linewidth fiber Bragg gratings) in the laser cavity while a (usually electronically-) tunable high-finesse filter (which may be transmissive or reflective) is actuated to select the desired wavelength output. The reflective filters (usually fiber Bragg gratings) feed back preselected wavelengths while the transmissive filter (usually a tunable fiber Fabry-Perot or FBGs in transmission mode) adds a second level of wavelength selectivity, such that tuning of the transmission peaks enables selection of the emission wavelength.

Optical isolators are used, where appropriate, to ensure unidirectional operation and, in the case of embodiments employing FFP transmissive filters, to prevent feedback arising from wavelengths reflected off the non-transmissive FFP bands. Optical circulators, in combination with reflective filters (usually fiber Bragg gratings), are employed in specific embodiments to allow for efficient low-loss precise wavelength feedback from the pre-designated set (single or multiple) of wavelengths. Polarization control is introduced at appropriate places in the cavity to ensure optimal output powers and stability.

Now that the basic concepts of the invention have been described, we will now describe specific structures that utilize the teachings of the two embodiments above. Turning now to FIG. 1, a Sagnac ring laser cavity configuration is illustrated. Pump source 100 generates light beam 102 at a preselected wavelength $\lambda_1$, such as 980 nm, which travels through gain medium 105. Gain medium 105 is preferably a doped fiber optic waveguide, such as Er:Silica, or a pigtailed Semiconductor Optical Amplifier etc. Gain medium 105 may be placed in either arm of the laser configuration or in the transmissive filter loop. The wave travels through fused fiber coupler 110 and is then partially reflected by fiber Bragg grating 115. In a preferred embodiment, the reflection would be between 10% and 100%. Coupler 110 may be a waveguide Y, pigtail, multiple branch elements, N-port circulators, etc. FBGs may be any type of reflective filters such as discrete FBGs, sampled gratings, an interferometric reflective filter, an arrayed waveguide grating with reflective elements on output ports, tunable Bragg gratings as disclosed in U.S. patent application Ser. No. 09/246,125 etc. The wave then travels back through fused fiber coupler 110 and gain medium 105 and is further tuned by fiber Fabry-Perot tunable filter (FFP) 120. FFP 120 may be any sort of multiple or single-passband (notch) transmissive filter such as an FFP, sampled FBG, FBG in transmission mode, tunable Bragg gratings as disclosed in U.S. patent application Ser. No. 09/246,125, waveguide ring resonators, etc. The output of fiber Fabry-Perot filter 120 is fed into an optional optical isolators 121 and fused fiber coupler 110 and passed through fiber Bragg grating 115 to create output 125 having an output wavelength $\lambda_2$.

The transmissive filter of the present invention may be an FFP with coated fiber mirrors, FFP with FBG mirrors, phase-shifted FBG-based transmission filters, waveguide ring resonator filters, MEMs-based FFPs, etc. Electronically tunable filters may be PZT-tuned FBGs, EO-tunable FBGs, PZT-tuned FFP, MEMs-based tunable FFP, etc. FBGs may be single frequency, multiple frequency (sampled FBG), etc.

Preferably, a 0.08 nm linewidth fiber Bragg grating (FBG), with a reflectivity of 25%, centered at 1531.08 in a Sagnac loop geometry may be used. The fiber Fabry-Perot (FFP) provides intracavity wavelength tunability to the source. The filter has a 20 GHz free spectral range (FSR) and a 20 MHz linewidth (LW). The isolators prevent unwanted reflective feedback from the high reflectivity FFP mirror surfaces.

An instrument-limited linewidth of 0.05 nm and 15 GHz of maximum tuning centered in the vicinity of the FBG peak are demonstrated. The observed output powers (2 mW max), however, show 10% fluctuations, and spectral instability (estimated to be approximately 1 GHz).

Figure 1B:
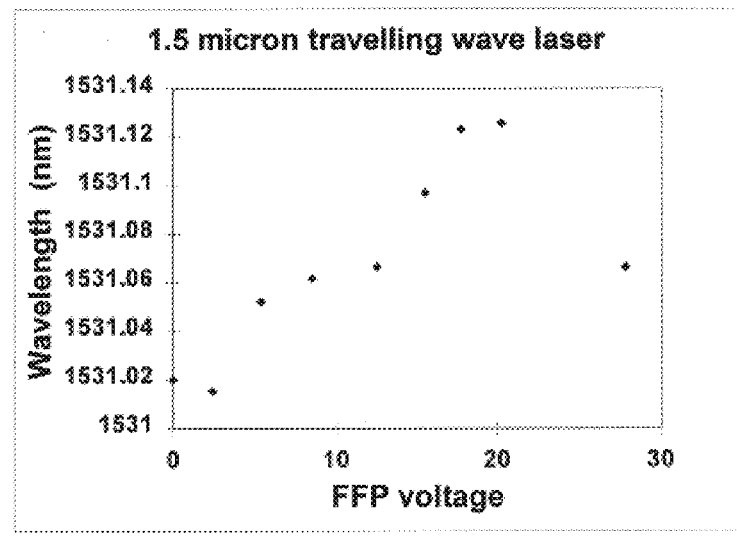
FIG. 1B is a tuning curve for a travelling wave laser constructed in accordance with FIG. 1A.

FIG. 1B shows the tuning curve for a 1.5 micron travelling wave laser arranged according to FIG. 1A.

Figure 2A:
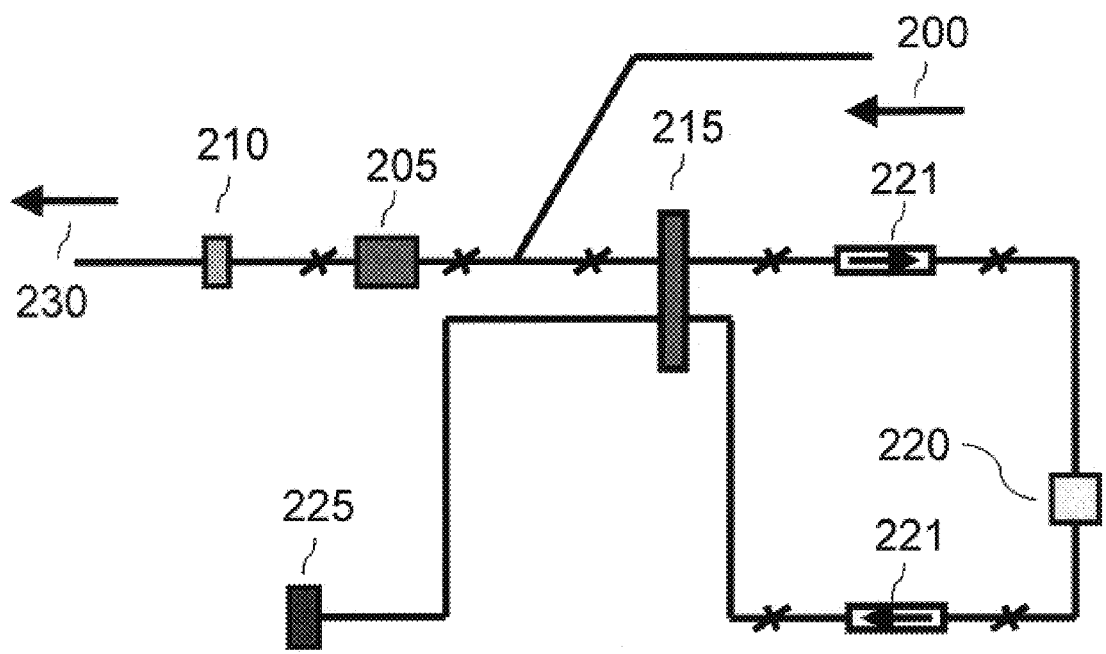
FIG. 2A is a schematic diagram of a standing wave laser.

FIG. 2A shows a linear cavity standing wave laser arrangement. A pump source generates light beam 200 at a preselected wavelength $\lambda_1$, such as 980 nm, which travels through gain medium 205. Gain medium 205 may be doped fiber optic waveguide, such as Er:Silica, or a pigtailed Semiconductor Optical Amplifier, etc. Gain medium 205 may be placed in either arm of the laser configuration or in the transmissive filter loop. The wave interacts with fiber Bragg grating 210 and is partially reflected. In a preferred embodiment, the reflection would be between 10% and 100%. FBGs may be any type of reflective filters, for example but not limited to, discrete FBGs, sampled gratings, an interferometric reflective filter, an arrayed waveguide grating with reflective elements on output ports, or tunable Bragg gratings as disclosed in U.S. patent application Ser. No. 09/246,125. Light beam 200 travels through gain medium 205 and coupler 215 and is further tuned by fiber Fabry-Perot tunable filter 220. Coupler 215 may be a fused fiber coupler, waveguide Y, pigtail, multiple branch elements, N-port circulators, etc. FFP 220 may be any sort of multiple or single-passband (notch) transmissive filter such as an FFP, sampled FBG, FBG in transmission mode, waveguide ring resonators, etc. The output of fiber Fabry-Perot filter 220 is fed into an optional optical isolators 221 and coupler 215 and either passed through fiber Bragg grating 210 to create an output wavelength $\lambda_2$ 230 or passed through coupler 215 to BB mirror 225 and reflected. The reflection of BB mirror 225 causes the laser to oscillate at the points where the modes coincide. In a preferred embodiment, mirror 225 has the following properties, reflective at the pump wavelength between 10% and 100%. The effective linear cavity FSR (not shown) will be larger than the FSR of the laser of FIG. 1A due to this vernier effect.

The standing wave laser of FIG. 2A exhibits 19 GHz of maximum tuning based on the FFP 220 selected and the input voltage applied thereto. Within the limits of the optical spectrum analyzer resolution, no spectral peak instabilities are discerned. Output power fluctuations are approximately 1%, suggesting high levels of stability due to minimal longitudinal mode competition within the FFPs 20 MHz transmission LW due to the large effective FSR.

Figure 2B:
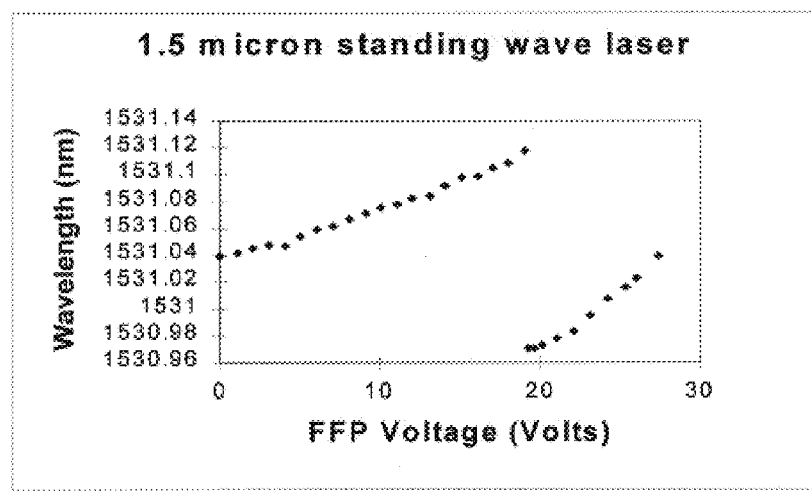
FIG. 2B is a tuning curve for a standing wave laser constructed in accordance with FIG. 2A.

FIG. 2B shows the tuning curve for a 1.5 micron standing wave laser arranged according to FIG. 2A.

Figure 3:
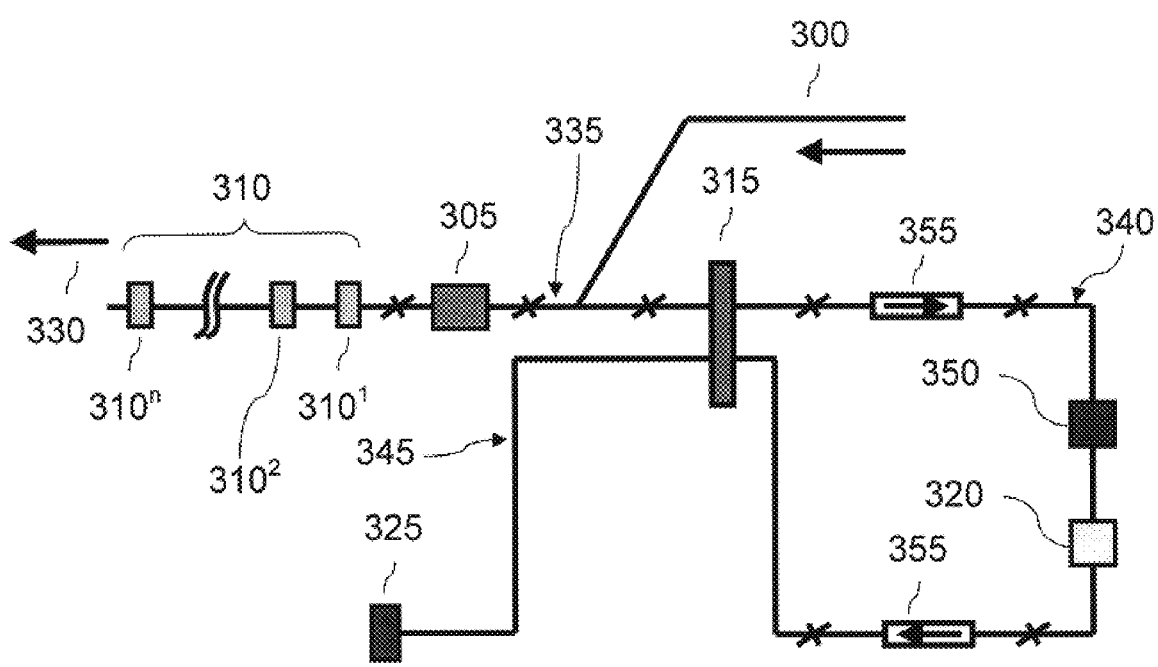
FIG. 3 is a schematic drawing of a linear cavity standing wave laser according to a preferred embodiment of the invention.

FIG. 3 shows a linear cavity standing wave laser arrangement. A pump source generates input light beam 300 at a preselected wavelength $\lambda_1$, such as 980 nm, which travels through gain medium 305. Gain medium 305 may be a doped fiber optic waveguide, such as Er:Silica, or a pigtailed Semiconductor Optical Amplifier, etc. Gain medium 305 may be operated through current injection (e.g. semiconductor laser amplifier), or pumped by optical means from any side, singly or bidirectionally. Gain medium 305 may be placed in output segment arm 335, transmissive filter loop 340, or in segment arm 345, singly or multiply. The wave interacts with fiber Bragg grating (FBG) 310 and is partially reflected. FBG 310 may be a single element comb reflective filter, discrete set of reflective filters, tunable Bragg gratings as disclosed in U.S. patent application Ser. No. 09/246,125 etc. FBGs may be any type of reflective filters, for example but not limited to, discrete FBGs, sampled gratings, an interferometric reflective filter, or an arrayed waveguide grating with reflective elements on output ports, tunable Bragg gratings as disclosed in U.S. patent application Ser. No. 09/246,125 etc. Light beam 300 travels through coupler 315 and is further tuned by fiber Fabry-Perot tunable filter 320. Light beam 300 may contact optional polarization control element 350, which may be in output segment arm 335, transmissive filter loop 340, or in segment arm 345, singly or multiply. Coupler 315 may be a 3 dB coupler, a fused fiber coupler, waveguide Y, pigtail, multiple branch elements, N-port circulators, etc. FFP 320 may be any sort of multiple or single-passband (notch) transmissive filter such as an FFP, sampled FBG, FBG in transmission mode, waveguide ring resonators, etc. The output of fiber Fabry-Perot filter 320 is fed through optional optical isolators 355 and into coupler 315 and either passed through fiber Bragg grating 310 to create an output wavelength $\lambda_2$ 330 or passed through coupler 315 to BB mirror 325 and reflected. The reflection of BB mirror 325 causes the laser to oscillate at the points where the modes coincide. In a preferred embodiment, mirror 325 has the following properties, reflective at the pump wavelength between 10% and 100%. The effective linear cavity FSR (not shown) will be larger than the FSR of the laser of FIG. 1A due to this vernier effect.

The switchable fiber lasers of the present invention may be designed using linear, ring, multiple cavity configurations, etc. The configurations may be a linear cavity standing wave laser, a Sagnac ring (based on fused fiber coupler) travelling wave laser, a ring cavity (based on optical circulators), etc. The configuration may also incorporate multiple cavities. A feature of each of these configurations is the use of an FFP having a switching speed of less than 1 milliseconds, or less than 100 microseconds in another preferred embodiment, and most preferably less than 10 microseconds.

Although only switching between two pre-designated wavelengths has been shown for the embodiments described above, it should be appreciated that switching between multiple precise DWDM channels is within the scope of the present invention. This switching is achieved by (1) dynamically adjusting the input voltage to the FFP; (2) dynamically adjusting the resonant frequency of the FBG; or (3) a combination of methods (1) and (2).

Figure 4:
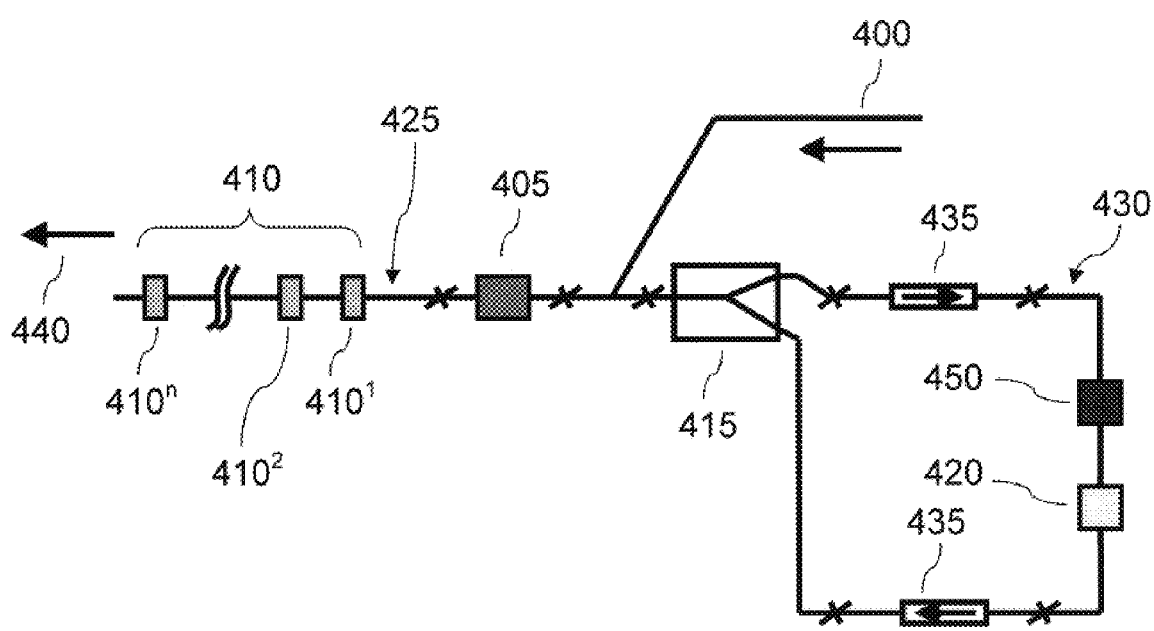
FIG. 4 is a schematic drawing of a standing wane laser according to an alternate embodiment of the invention.

FIG. 4 shows a preferred embodiment of a standing wave laser of the invention using pumped input light beam 400 at a preselected wavelength $\lambda_1$, such as 980 nm, to produce output wavelength $\lambda_2$ 440. Gain medium 405 may be a doped fiber optic waveguide, such as Er:Silica, or a semiconductor optical amplifier, etc. Gain medium 405 may be operated through current injection (e.g. semiconductor laser amplifier), or pumped by optical means from any side, singly or bidirectionally. Gain medium 405 may be placed in output segment arm 425 or in transmissive filter loop 430, singly or multiply. FBGs 410 feed back pre-selected wavelengths $\lambda_1$, and $\lambda_2$, while tunable fiber Fabry-Perot filter 420 adds a second level of wavelength selectivity, such that voltage tuning of the FFP transmission peaks, via an input voltage, enables selection of the desired single-wavelength output. In a preferred embodiment, the FBG reflectivity would be between 10% and 100%. FFP 420 may be any sort of multiple or single-passband (notch) transmissive filter such as an FFP, sampled FBG, FBG in transmission mode, tunable fiber Bragg gratings as disclosed in U.S. patent application Ser. No. 09/246,125, waveguide ring resonators, etc. Light beam 400 also interacts with optional polarization control element 450, which may be in output segment arm 425 or in transmissive filter loop 430, singly or multiply. The output of FFP 420 is fed through optional optical isolators 435. FBGs 410 may be a single element comb reflective filter, a discrete set of reflective filters, or a set of tunable fiber Bragg gratings as disclosed in U.S. patent application Ser. No. 09/246,125, depending on the required levels of selectivity. Coupler 415 may be a 3 dB coupler, a fused fiber coupler, waveguide Y. pigtail, multiple branch elements, N-port circulators, etc.

Figure 5:
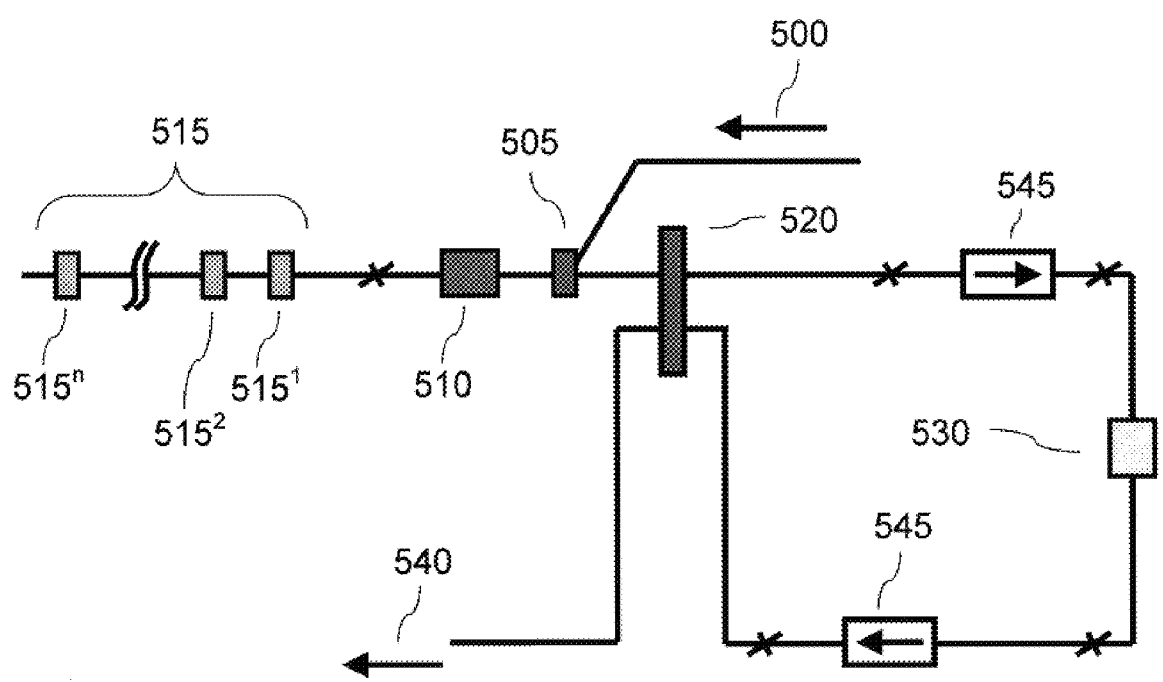
FIG. 5 is a schematic diagram of a wavelength-selectable fiber laser according to an alternate embodiment of the invention.

FIG. 5 shows an alternate embodiment of the invention using pumped input beam 500 at a preselected wavelength $\lambda_a$, such as 980 nm, to produce output wavelength $\lambda_b$ 540, such as 1.5 μm based on a 980 nm input. Input beam 500 engages WDM coupler 505 and travels through gain medium 510, which may be a doped fiber optic waveguide, such as Er:Silica, or a semiconductor optical amplifier, etc. Gain medium 510 may be operated through current injection (e.g. semiconductor laser amplifier), or pumped by optical means from any side, singly or bidirectionally. Gain medium 510 may be placed in either arm of the laser configuration or in the transmissive filter loop. FBGs 515 reflect pre-selected wavelengths $\lambda_1$ and $\lambda_2$, while tunable fiber Fabry-Perot filter 530 adds a second level of wavelength selectivity, such that voltage tuning of the FFP transmission peaks enables selection of the desired single-wavelength output. In a preferred embodiment, the FBG reflectivity would be between 10% and 100%. FFP 530 may be any sort of multiple or single-passband (notch) transmissive filter such as an FFP, sampled FBG, FBG in transmission mode, tunable fiber Bragg gratings as disclosed in U.S. patent application Ser. No. 09/246,125, waveguide ring resonators, etc. The output of FFP 530 is fed through optional optical isolators 545. FBGs 515 may be a single element comb reflective filter, a discrete set of reflective filters, tunable Bragg gratings as disclosed in U.S. patent application Ser. No. 09/246,125, etc. depending on the required levels of selectivity. Coupler 520 may be a 3 dB coupler, a fused fiber coupler, waveguide Y, pigtail, multiple branch elements, N-port circulators, etc.

Figure 6:
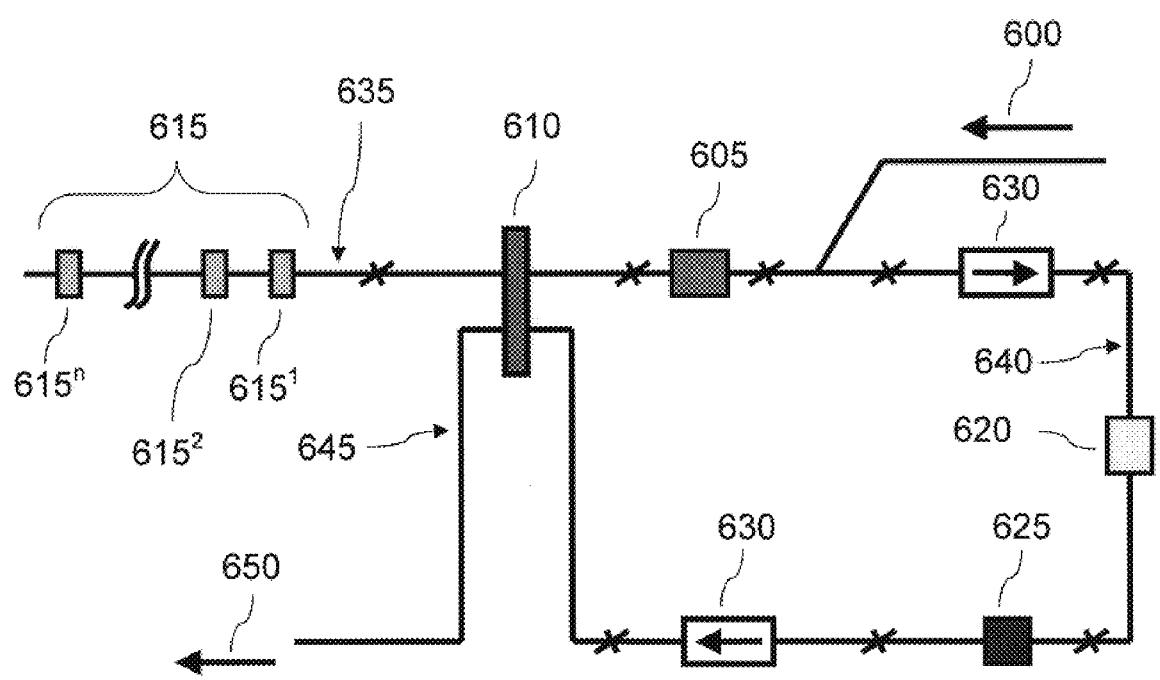
FIG. 6 is a schematic drawing of a quasi-unidirectional travelling wave laser according to yet another alternate embodiment of the invention.

FIG. 6 shows a quasi-unidirectional travelling wave laser of the present invention using pump input light beam 600 at a preselected wavelength $\lambda_a$, such as 980 nm, to produce output wavelength $\lambda_b$ 650. Gain medium 605 may be doped fiber, such as Er:Silica, or a semiconductor optical amplifier, etc. Gain medium 605 may be operated through current injection (e.g. semiconductor laser amplifier), or pumped by optical means from any side, singly or bidirectionally. Gain medium 605 may be placed in first segment arm 635, in transmissive filter loop 640, or in second segment arm 645, singly or multiply. FFP 620 may be any sort of multiple or single-passband (notch) transmissive filter such as an FFP, sampled FBG, FBG in transmission mode, waveguide ring resonators, etc. Light beam 600 also interacts with optional optical isolators 630 in transmissive filter loop 640. Optional polarization control element 625 may be placed in first segment arm 635, transmissive filter loop 640, or in second segment arm 645, singly or multiply. FBGs 615 may be a single element comb reflective filter, a discrete set of reflective filters, tunable Bragg gratings as disclosed in U.S. patent application Ser. No. 09/246,125, etc. depending on the required levels of selectivity. Coupler 610 may be performed by a 3 dB coupler, a fused fiber coupler, waveguide Y, pigtail, multiple branch elements, N-port circulators, etc.

Figure 7:
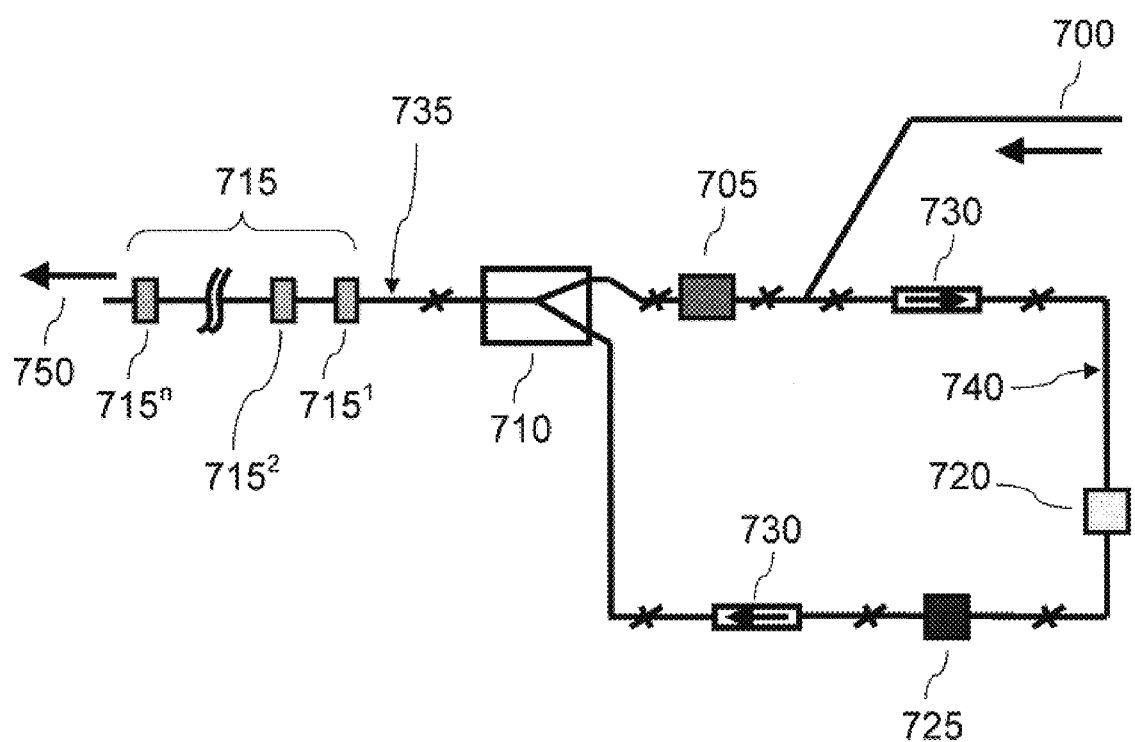
FIG. 7 is a schematic drawing of a quasi-unidirectional travelling wave laser according to yet another alternate embodiment of the invention.

FIG. 7 shows a quasi-unidirectional travelling wave laser of the present invention using pump input light beam 700 at a preselected wavelength $\lambda_a$, such as 980 nm, to produce output wavelength $\lambda_b$ 750. Gain medium 705 may be a doped fiber optic waveguide, such as Er:Silica, or a semiconductor optical amplifier, etc. Gain medium 705 may be operated through current injection (e.g. semiconductor laser amplifier), or pumped by optical means from any side, singly or bidirectionally. Gain medium 705 may be placed in segment arm 735 or in transmissive filter loop 740, singly or multiply. FFP 720 may be any sort of multiple or single-passband (notch) transmissive filter such as an FFP, sampled FBG, FBG in transmission mode, tunable Bragg gratings as disclosed in U.S. patent application Ser. No. 09/246,125, waveguide ring resonators, etc. Light beam 700 also interacts with optional optical isolators 730 in transmissive filter loop 740. Optional polarization control element 725 may be placed in segment arm 735 or in transmissive filter loop 740, singly or multiply. FBGs 715 may be a single element comb reflective filter, a discrete set of reflective filters, tunable Bragg gratings as disclosed in U.S. patent application Ser. No. 09/246,125, etc. depending on the required levels of selectivity. Coupler 710 may be performed by a 3 dB coupler, a fused fiber coupler, waveguide Y, pigtail, multiple branch elements, N-port circulators, etc.

Figure 8:
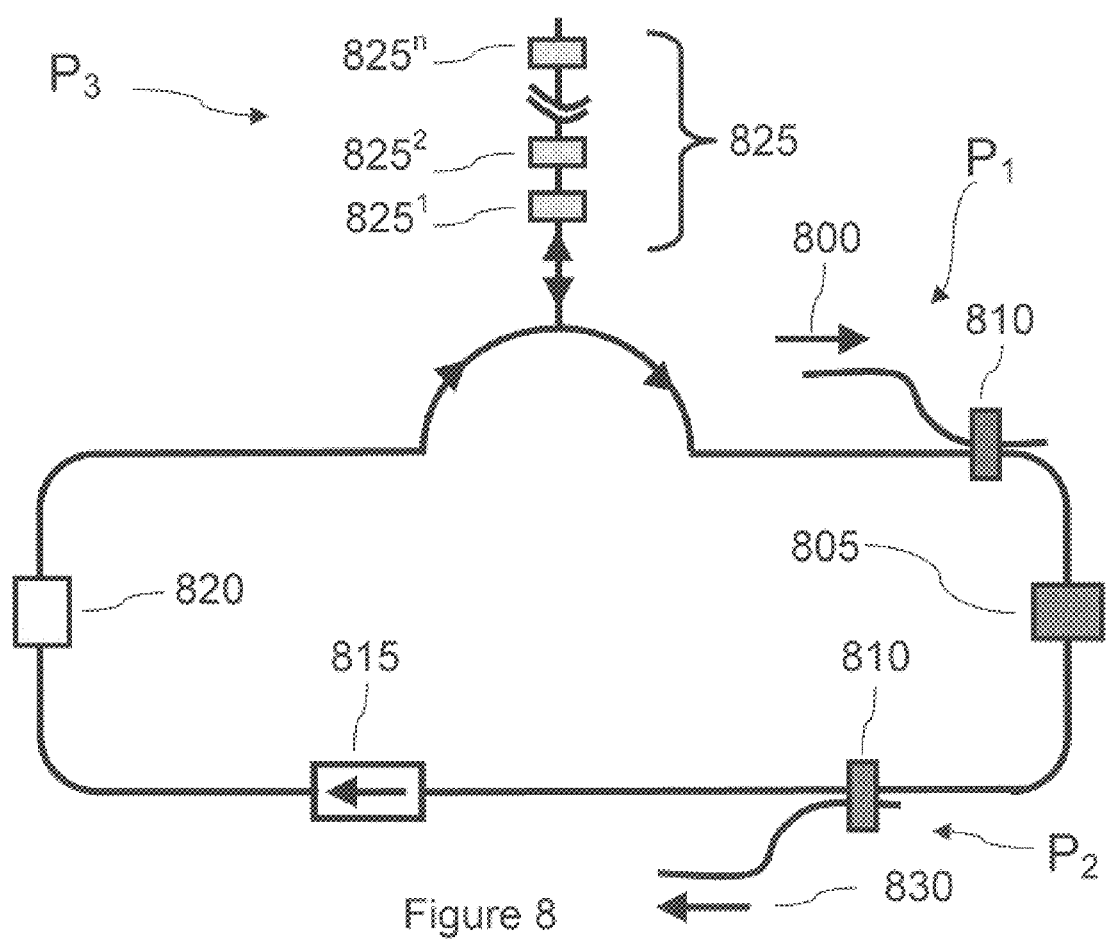
FIG. 8 is a schematic drawing of wavelength-switchable and tunable fiber laser using a three-port circulator according to yet another alternate embodiment of the present invention.

FIG. 8 shows a wavelength-switchable and tunable fiber laser of the present invention using a three-port circulator and pump input light beam 800 at a preselected wavelength $\lambda_a$ such as 980 nm, to produce output wavelength $\lambda_b$ 830. The three ports are labeled $P_1$, $P_2$ and $P_3$. Gain medium 805 may be a doped fiber optic waveguide, such as Er:Silica, or a semiconductor optical amplifier, etc. Gain medium 805 may be operated through current injection (e.g. semiconductor laser amplifier), or pumped by optical means from any side, singly or bidirectionally. Light beam 800 passes through optional optical isolators 815, coupler 810 and FFP 820. FFP 820 may be any sort of multiple or single-passband (notch) transmissive filter such as an FFP, sampled FBG, FBG in transmission mode, tunable Bragg gratings as disclosed in U.S. patent application Ser. No. 09/246,125, waveguide ring resonators, etc. FBGs 825 may be a single element comb reflective filter, a discrete set of reflective filters, tunable Bragg gratings as disclosed in U.S. patent application Ser. No. 09/246,125, etc. depending on the required levels of selectivity. Coupler 810 may be a 3 dB coupler, a fused fiber coupler, waveguide Y, pigtail, multiple branch elements, N-port circulators, etc. Optional polarization control elements (not pictured) may be added to the loop singly or multiply.

Figure 9:
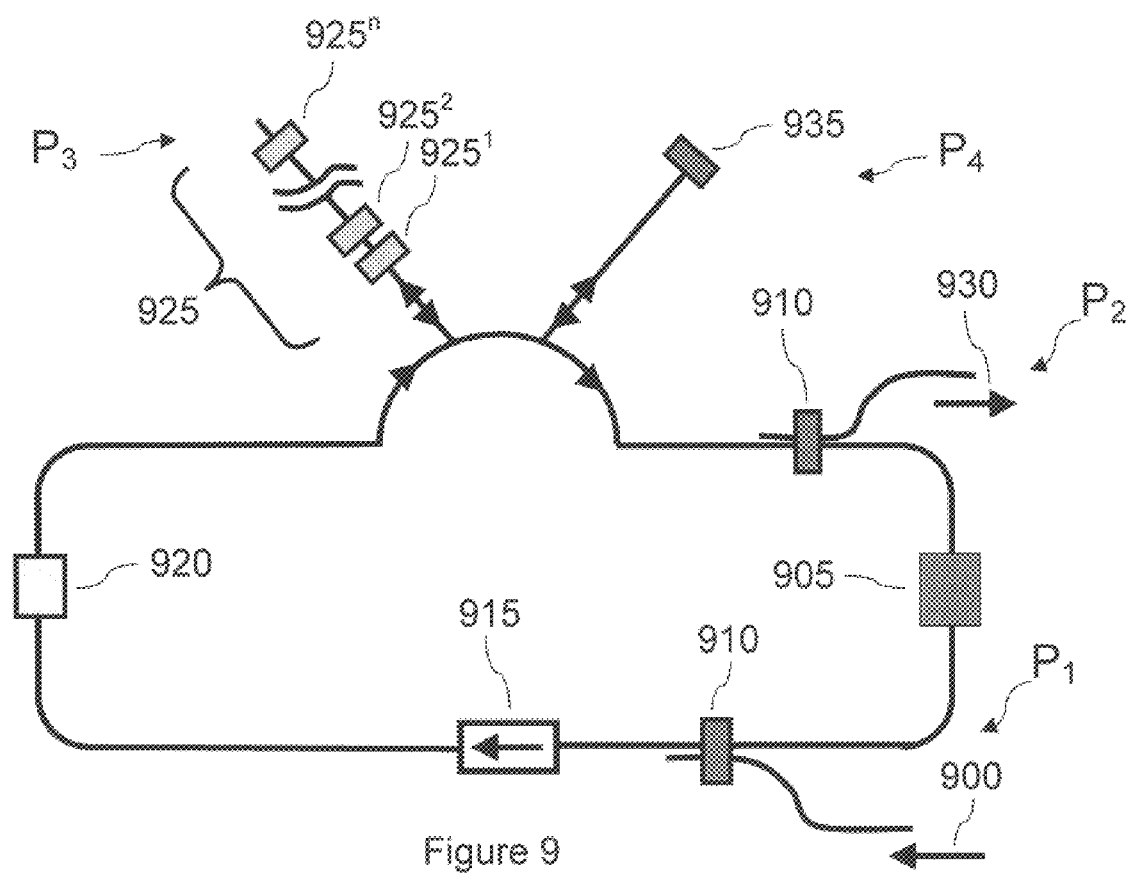
FIG. 9 is a schematic drawing of wavelength-switchable and tunable fiber laser using a four-port circulator according to yet another alternate embodiment of the present invention.

FIG. 9 shows a wavelength-switchable and tunable fiber laser of the present invention using a four-port circulator with input 900 at a preselected wavelength $\lambda_a$ such as 980 nm to produce output wavelength $\lambda_b$ 930. The four ports are indicated as $P_1$, $P_2$ $P_3$ and $P_4$. Gain medium 905 may be a doped fiber optic waveguide, such as Er:Silica, or a semiconductor optical amplifier, etc. Gain medium 905 may be operated through current injection (e.g. semiconductor laser amplifier), or pumped by optical means from any side, singly or bidirectionally. The light beam passes through optional optical isolators 915, coupler 910 and FFP 920. FFP 920 may be any sort of multiple or single-passband (notch) transmissive filter such as an FFP, sampled FBG, FBG in transmission mode, tunable Bragg gratings as disclosed in U.S. patent application Ser. No. 09/246,125, waveguide ring resonators, etc. FBGs 925 may be a single element comb reflective filter, a discrete set of reflective filters, tunable Bragg gratings as disclosed in U.S. patent application Ser. No. 09/246,125, etc. depending on the required levels of selectivity. Coupler 910 may be a 3 dB coupler, a fused fiber coupler, waveguide Y, pigtail, multiple branch elements, N-port circulators, etc. Optional polarization control elements (not pictured) may be added to the loop singly or multiply. The reflection of mirror 935 causes the laser to oscillate at the points where the modes coincide.

Figure 10:
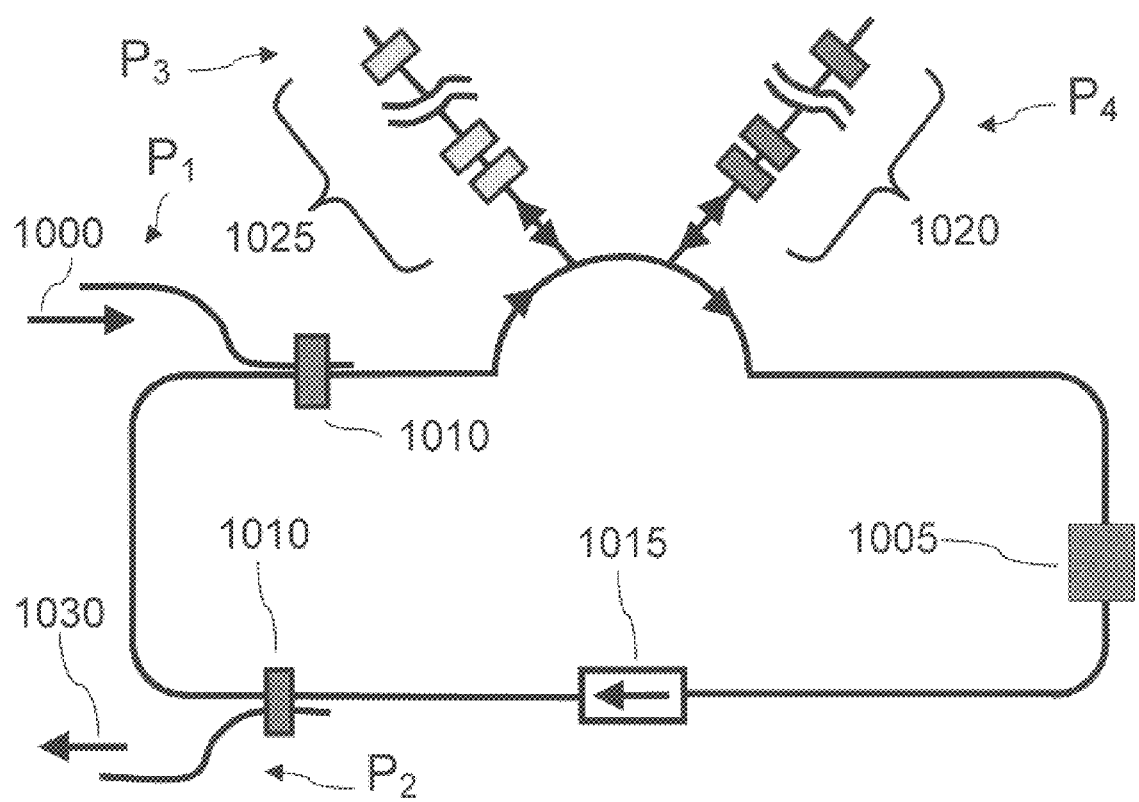
FIG. 10 is a schematic drawing of wavelength-switchable and tunable fiber laser using a four-port circulator or two cascaded 3-ports according to yet another alternate embodiment of the present invention.

FIG. 10 shows a wavelength-switchable and tunable fiber laser of the present invention using a four-port circulator or two cascaded 3-ports with input 1000 at a preselected wavelength $\lambda_a$, such as 980 nm, to produce output $\lambda_b$ 1030. The four ports are indicated as $P_1$, $P_2$ $P_3$ and $P_4$. Gain medium 1005 may be a doped fiber optic waveguide, such as Er:Silica, or a semiconductor optical amplifier, etc. Gain medium 1005 may be operated through current injection (e.g. semiconductor laser amplifier), or pumped by optical means from any side, singly or bidirectionally. The light beam passes through optional optical isolators 1015, coupler 1010 and FFPs 1020. FBGs 1025 may be a single element fixed-frequency-comb reflective filter, a discrete set of reflective fixed-frequency filters, tunable Bragg gratings as disclosed in U.S. patent application Ser. No. 09/246,125, etc. depending on the required levels of selectivity. FFPs 1020 may be a single element tunable frequency-comb filter or a discrete set of reflective tunable filters. FFPs 1020 may be any sort of multiple or single-passband (notch) transmissive filter such as an FFP, sampled FBG, FBG in transmission mode, tunable Bragg gratings as disclosed in U.S. patent application Ser. No. 09/246,125, waveguide ring resonators, etc. Coupler 1010 may be a 3 dB coupler, a fused fiber coupler, waveguide Y, pigtail, multiple branch elements, N-port circulators, etc. Optional polarization control elements (not pictured) may be added to the loop singly or multiply.

Figure 11:
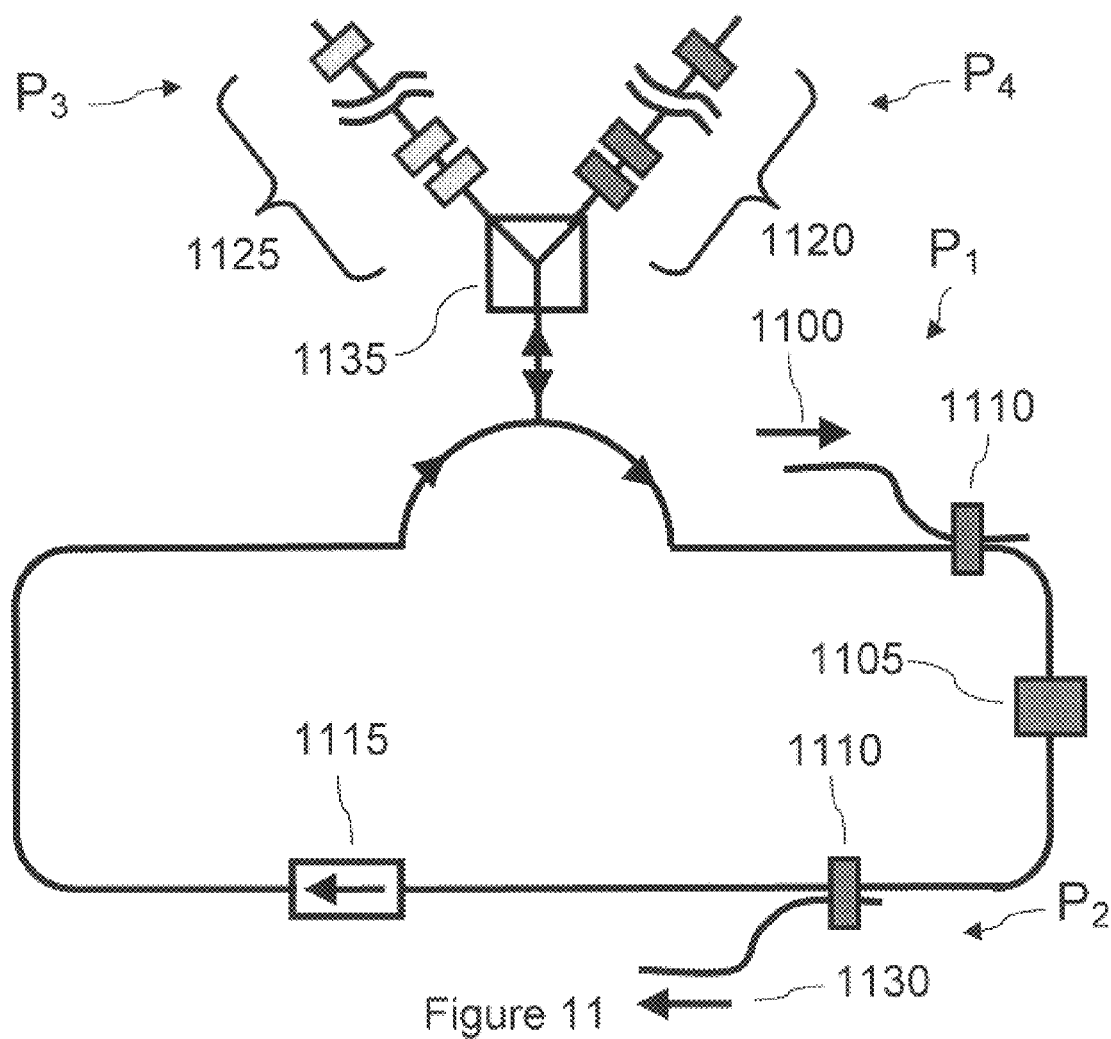
FIG. 11 is a schematic drawing of wavelength-switchable and tunable fiber laser using a three-port circulator according to yet another alternate embodiment of the present invention.

FIG. 11 shows a wavelength-switchable and tunable fiber laser of the present invention using a four-port circulator and pump input light beam 1100 at a preselected wavelength $\lambda_a$, such as 980 nm, to produce output wavelength $\lambda_b$ 1130. The four ports are indicated as $P_1$, $P_2$ $P_3$ and $P_4$. Gain medium 1105 may be a doped fiber optic waveguide, such as Er:Silica, or a semiconductor optical amplifier, etc. Gain medium 1105 may be operated through current injection (e.g. semiconductor laser amplifier), or pumped by optical means from any side, singly or bidirectionally. The light beam passes through optional optical isolators 1115. FBGs 1125 may be a single element fixed-frequency-comb reflective filter, a discrete set of reflective fixed-frequency filters, tunable Bragg gratings as disclosed in U.S. patent application Ser. No. 09/246,125, etc. depending on the required levels of selectivity. FFPs 1120 may be a single element tunable frequency-comb filter or a discrete set of reflective tunable filters. FFPs 1120 may be any sort of multiple or single-passband (notch) transmissive filter such as an FFP, sampled FBG, FBG in transmission mode, tunable Bragg gratings as disclosed in U.S. patent application Ser. No. 09/246,125, waveguide ring resonators, etc. FBGs 1125 and FFPs 1120 are joined via coupler 1135. Coupler 1135 and second coupler 1110 may each be a 3 dB coupler, a fused fiber coupler, waveguide Y, pigtail, multiple branch elements, N-port circulators, etc. Optional polarization control elements (not pictured) may be added to the loop singly or multiply.

Figure 16:
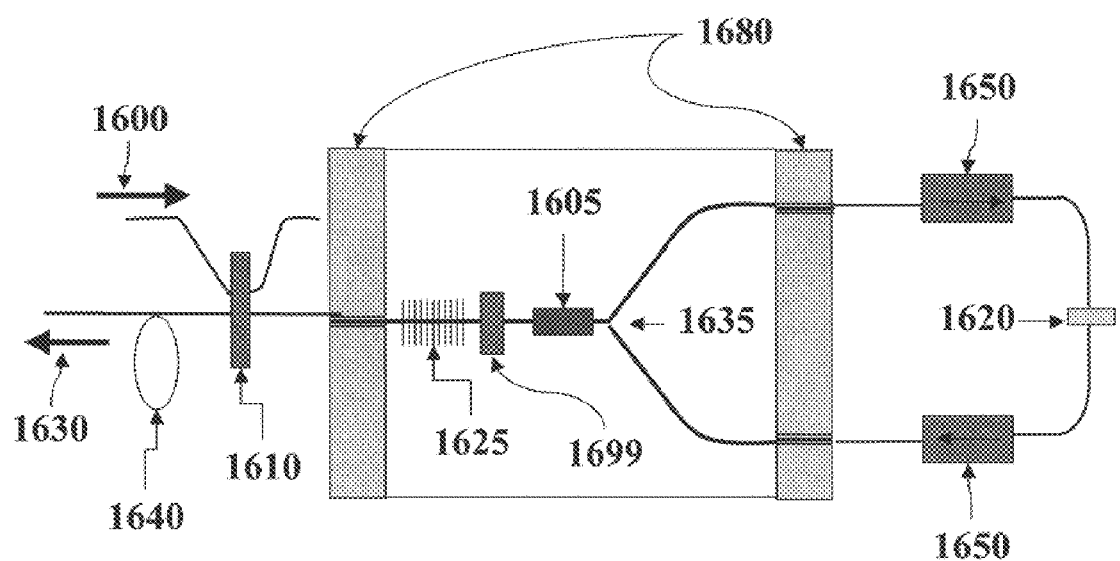
FIG. 16 illustrates a compact hybrid rapidly wavelength-switchable and wavelength-tunable continuous wave (CW) or pulsed source constructed in accordance with yet another embodiment of the invention.

FIG. 16 illustrates a compact hybrid rapidly wavelength-switchable and wavelength-tunable continuous wave (CW) or pulsed source constructed in accordance with yet another embodiment of the invention. In this embodiment, the components are fabricated from various technologies, namely: semiconductor, micro-optic, fiber-optic and glass waveguide technologies. This embodiment is a compact planar lightwave circuit design fabricated on a semiconductor (such as InP or Silicon) or glass substrate. Special anisotropic etching techniques (such as Deep RIE—

Reactive Ion Etching) capable of etching deep features (>100 μm) are utilized in this embodiment. These anisotropic etching techniques enable hybrid integration of components through high-tolerance self-alignment techniques. As may be seen, optical pump source 1600 (if necessary) is provided for optical pumping of doped glass gain medium 1605. An optional device for coupling in optical pump source 1610 is provided for coupling optional pump source 1600 to doped glass gain medium 1605. An output signal 1630 is generated by the device. In a preferred embodiment, gain medium 1605 is a rare-earth doped glass, including but not limited to Er:Silica, Er/Yb:Silica, Yb:Silica, Er:ZBLAN, Er/Pr:ZBLAN, Er/Yb ZBLAN) or a semiconductor optical amplifier. A wavelength-tunable or wavelength-stabilized Bragg grating 1625 (single-wavelength Bragg grating or multiple-wavelength sampled Bragg grating) is disposed between source 1600 and gain medium 1605. A rapidly wavelength-tunable filter 1620 is disposed in the transmissive loop which is connected to gain medium 1605 via a waveguide Y-branch or optical field coupling device 1635. An optional amplitude or phase modulation device 1299 may be disposed between gain medium 1605 and wavelength-tunable or wavelength-stabilized Bragg grating 1625. Optional optical isolators 1650 are disposed on either side of rapidly wavelength-tunable filter 1220. A coupling device 1680 is provided for facilitating optical fiber to waveguide coupling. One example of a coupling device is V-grooves or any other coupling device known in the art.

Figure 17:
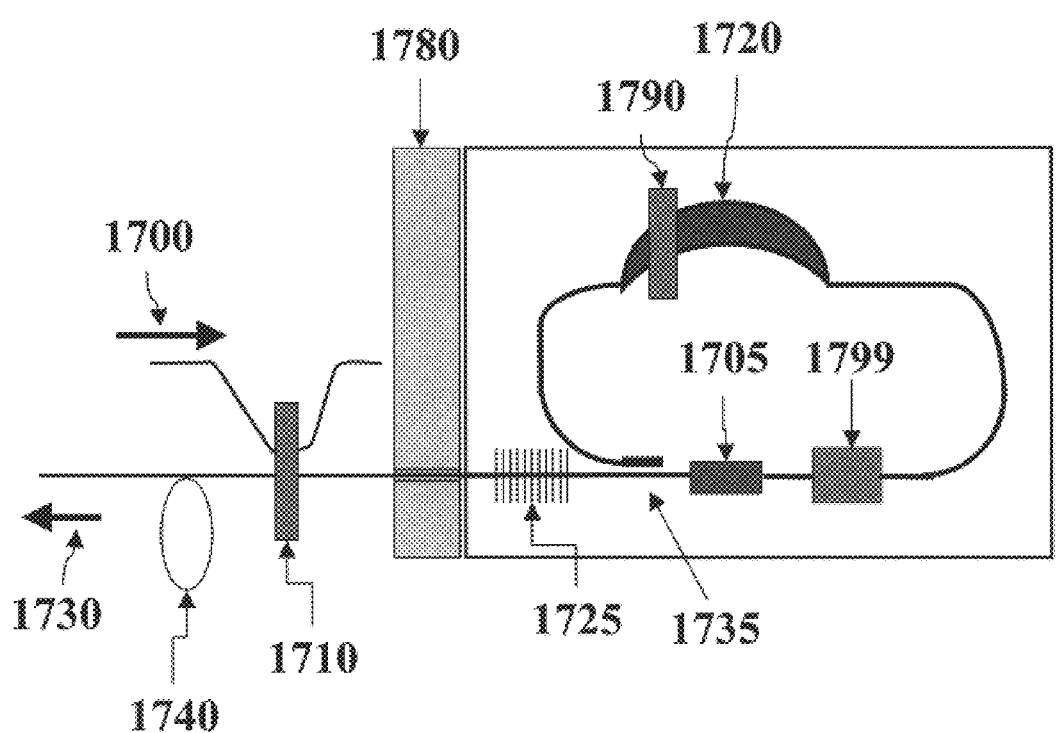
FIG. 17 illustrates a compact hybrid rapidly wavelength-switchable and wavelength-tunable continuous wave (CW) or pulsed source constructed in accordance with yet another embodiment of the invention.

FIG. 17 illustrates a compact hybrid rapidly wavelength-switchable and wavelength-tunable continuous wave (CW) or pulsed source constructed in accordance with yet another embodiment of the invention. As may be seen, components fabricated from various technologies, namely: semiconductor, micro-optic, fiber-optic and glass waveguide technologies are utilized in this embodiment. A compact planar lightwave circuit design is fabricated on a semiconductor (such as InP or Silicon) or glass substrate. Special anisotropic etching techniques such as Deep RIE and Reactive Ion Etching are utilized. These techniques are capable of etching deep features (>100 μm) which enable hybrid integration of components through high-tolerance self-alignment techniques. As may be seen, optical pump source 1700 (if necessary) is provided for optical pumping of doped glass gain medium 1705. An optional device for coupling in optical pump source 1710 is provided for coupling optional pump source 1700 to doped glass gain medium 1705. An output signal 1730 is generated by the device. In a preferred embodiment, gain medium 1705 is a rare-earth doped glass, including but not limited to Er:Silica, Er/Yb:Silica, Yb:Silica, Er:ZBLAN, Er/Pr:ZBLAN, Er/Yb ZBLAN) or a semiconductor optical amplifier. A wavelength-tunable or wavelength-stabilized Bragg grating 1725 (single-wavelength Bragg grating or multiple-wavelength sampled Bragg grating) is disposed between source 1700 and gain medium 1705. A tunable array waveguide grating (AWG) 1720 is disposed in the transmissive loop which is connected to gain medium 1705 via a optical field coupling device 1735. An optional amplitude or phase modulation device 1799 may be disposed between gain medium 1705 and tunable array waveguide grating (AWG) 1720. A coupling device 1780 is provided for facilitating optical fiber to waveguide coupling. One example of a coupling device is V-grooves or any other coupling device known in the art. As may be seen, a phase-modulated region 1790 is provided in tunable array waveguide grating (AWG) 1720. This phase-modulated region 1790 may include, but is not limited to: electro-absorptive material, PZT strained regions, and electro-optic material.

Figure 18:
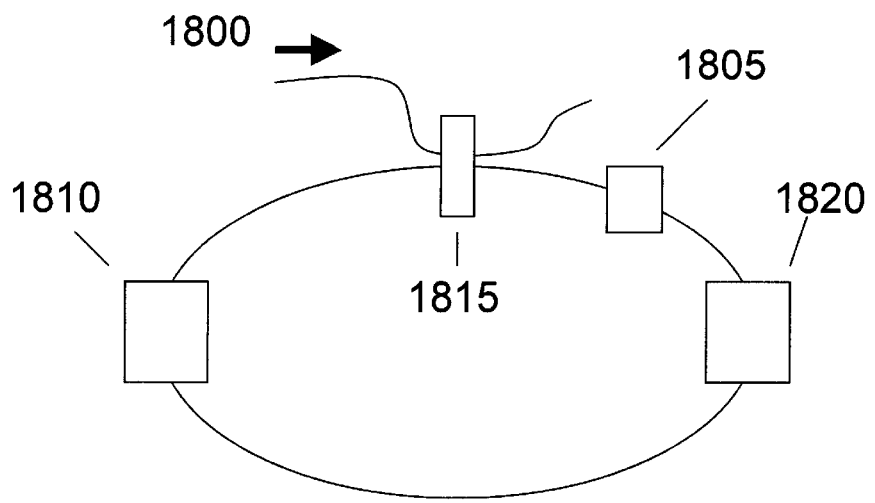
FIG. 18 illustrates a rapidly wavelength-switchable and wavelength-tunable continuous wave (CW) or pulsed source constructed in accordance with yet another embodiment of the invention.

Turning now to FIG. 18, an alternate embodiment is illustrated. As may be seen, optical pump source 1800 (if necessary) is provided for optical pumping of doped glass gain medium 1805. An optional device for coupling in optical pump source 1815 is provided for coupling optional pump source 1800 to doped glass gain medium 1815. In a preferred embodiment, gain medium 1815 is a rare-earth doped glass, including but not limited to Er:Silica, Er/Yb:Silica, Yb:Silica, Er:ZBLAN, Er/Pr:ZBLAN, Er/Yb ZBLAN) or a semiconductor optical amplifier. A wavelength-tunable or wavelength-stabilized multiwavelength grid filter 1810 (single-wavelength Bragg grating or multiple-wavelength sampled Bragg grating) is disposed distal from source 1800 and gain medium 1815. A rapidly wavelength tunable filter 1820 is disposed in the laser cavity resonator.

Figure 19:
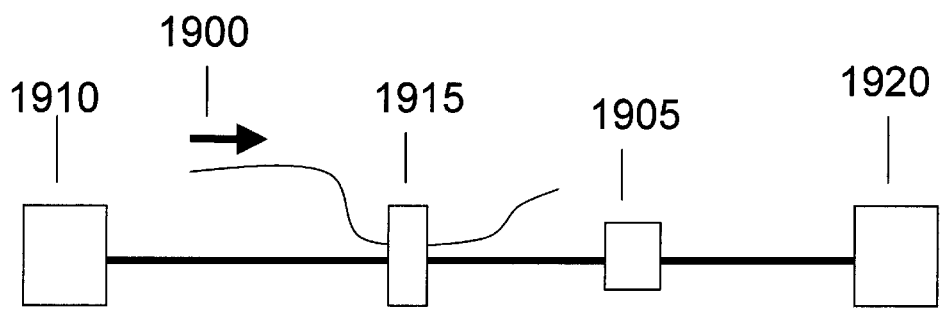
FIG. 19 illustrates rapidly wavelength-switchable and wavelength-tunable continuous wave (CW) or pulsed source constructed in accordance with yet another embodiment of the invention.

Turning now to FIG. 19, an alternate embodiment is illustrated. As may be seen, optical pump source 1900 (if necessary) is provided for optical pumping of doped glass gain medium 1905. An optional device for coupling in optical pump source 1915 is provided for coupling optional pump source 1900 to doped glass gain medium 1915. In a preferred embodiment, gain medium 1915 is a rare-earth doped glass, including but not limited to Er:Silica, Er/Yb:Silica, Yb:Silica, Er:ZBLAN, Er/Pr:ZBLAN, Er/Yb ZBLAN) or a semiconductor optical amplifier. A wavelength-tunable or wavelength-stabilized multiwavelength grid filter 1910 (single-wavelength Bragg grating or multiple-wavelength sampled Bragg grating) is disposed distal from source 1900 and gain medium 1915. A rapidly wavelength tunable filter 1920 is disposed in the laser cavity resonator.

Figure 12:
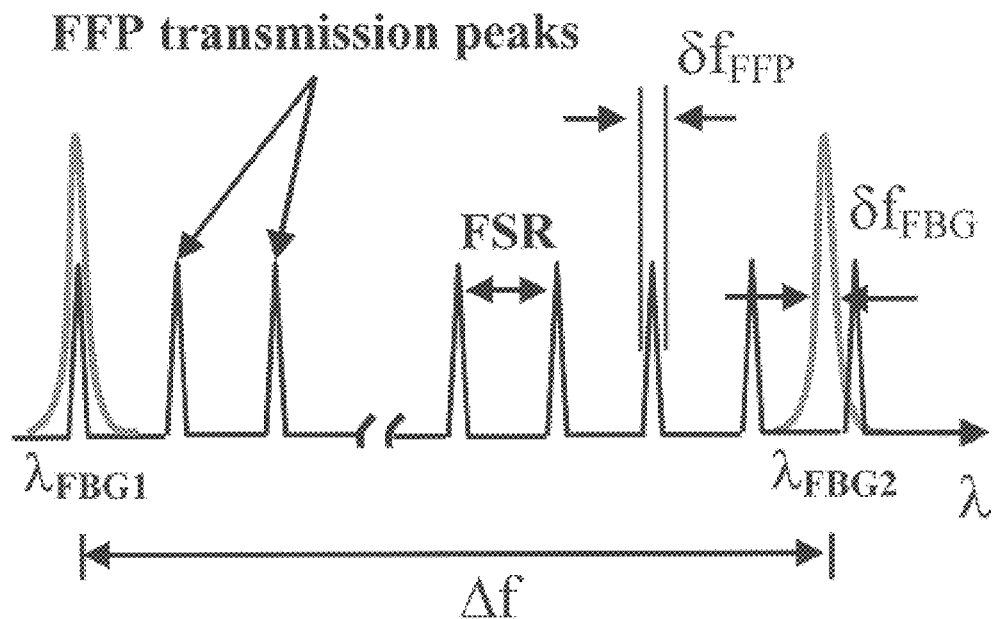
FIG. 12 is a diagram of the Channel Spacing of the laser of FIG. 5.

As shown in FIG. 12, when the FFP free spectral range (FSR)<Δf, a necessary condition for successful operation of the fiber laser at precisely λ-switchable narrow linewidth outputs is given by: $\text{Min}(|n\,\Delta f - m\,\text{FSR}|) > \delta_{tolerance}$, where n and m are integers, $\delta_{tolerance} \sim \frac{1}{2}(\delta f_{FFP} + \delta f_{FBG})$ and $\delta f_{FFP}$ and $\delta f_{FBG}$.

One example of a design wherein the FFP FSR<Δf involves eight channels with Δf=50 GHz. A coordinate FFP has an FSR of about 44 GHz, which requires a $\delta f_{tolerance}$ of about 5 GHz.

Figure 13:
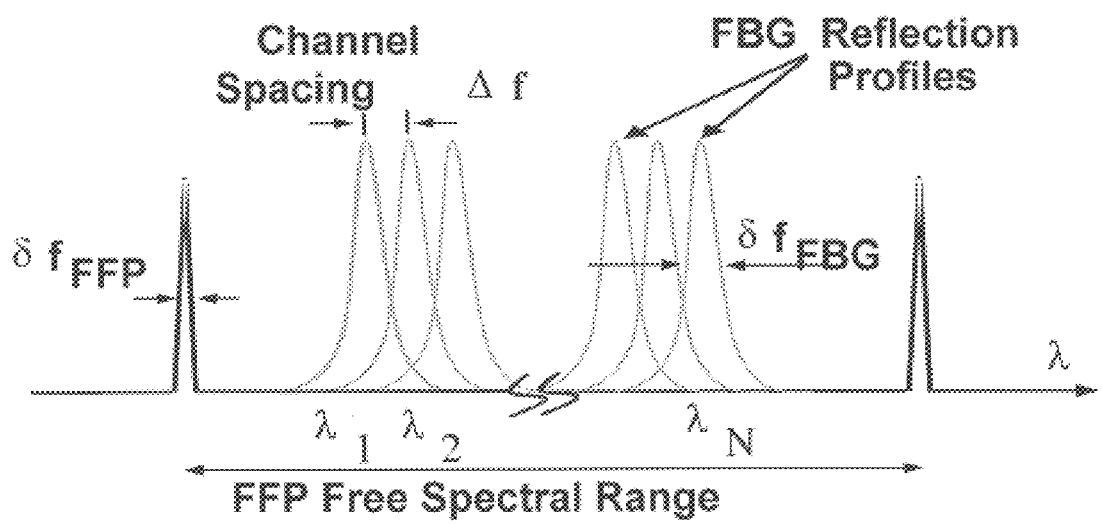
FIG. 13 is a diagram showing the FFP Free Spectral Range of the laser of FIG. 5.

Multi-wavelength switchable operation has also been illustrated in FIG. 13 for cases where FSR>Δf. To obtain the diagram of FIG. 13, for example, two FBGs may be used with peak reflectivities of approximately 30 dB and 3 dB linewidths of approximately 0.4 nm (50 GHz) at center wavelengths of 1551.68 nm ($\lambda_1$) and 1554.10 nm ($\lambda_2$). The FFP filter has a 5 GHz linewidth and a 5 THz (40 nm) free spectral range corresponding to a finesse of ~1000. Isolators are placed inside the loop to ensure unidirectional operation and to prevent feedback from wavelengths reflected off the bandstop regions of the FFP transmission spectrum. The output spectra may be easured using an Ando AQ-6315A optical spectrum analyzer which has a resolution of 0.05 nm, or by using a comparable device.

The speed of switching may be measured using a tunable bandpass filter and an isolator in front of a 1 GHz InGaAs photodetector. The bandpass filter may be tuned to one channel or another, to give a 30 dB rejection between the two channels. Rapid switching between the two wavelengths is accomplished with the use of a 1 KHz square wave input voltage source (~60 ns rise time) to drive the tunable FFP.

Figure 14A:
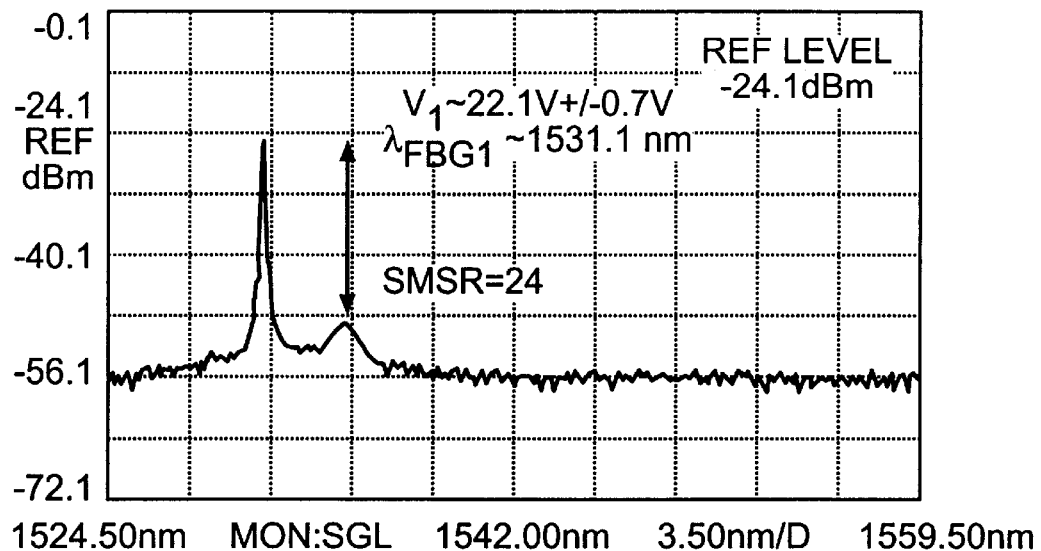
FIGS. 14A and 14B show the results of a two-channel switching demonstration and a spectrum range from 1524.50 nm to 1559.50 nm.
Figure 14B:
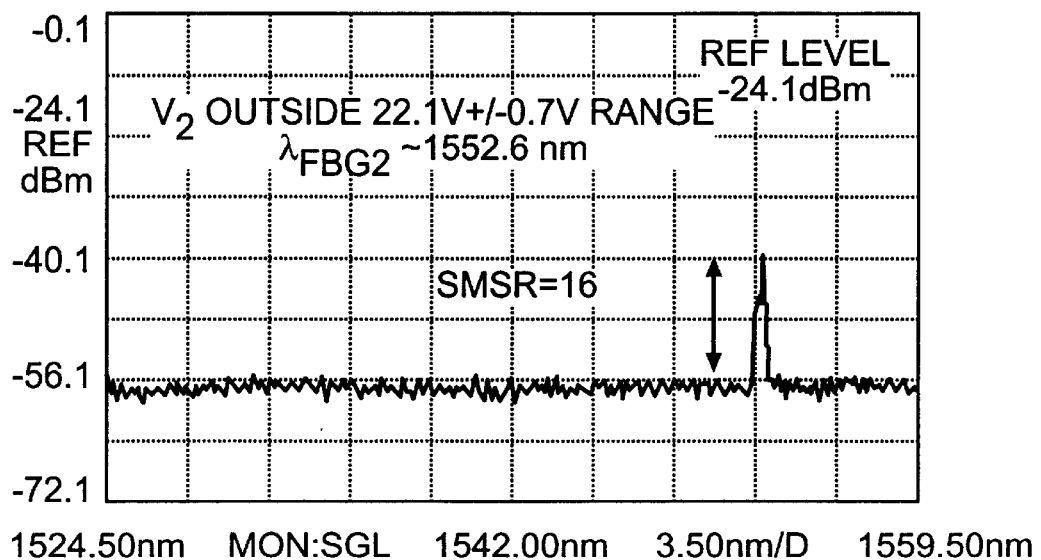

FIGS. 14A and 14B show the results of a two-channel switching demonstration and a spectrum range from 1524.50 nm to 1559.50 nm. FIG. 14A shows a wavelength peak at approximately 1531.1 nm with −0.4 dB, approximately 0.08 nm linewidth, and a range of 1.2 dB. The voltage was set in FIG. 14A at approximately 22.1 V+/−0.7 V. The resultant SMSR was 24 dB. FIG. 14B shows a wavelength peak at approximately 1552.6 nm with −3 dB, approximately 0.35 nm linewidth, and a range of 12 dB. The voltage was set in FIG. 14B at approximately 22.1 V+/−0.7 V. The resultant SMSR was 16 dB. The difference in SMSR results from asymmetry in Bragg grating strengths. The FFP for both FIGS. 14A and 14B had a finesse of approximately 1000 and a FSR of approximately 20 GHz.

Figure 15A:
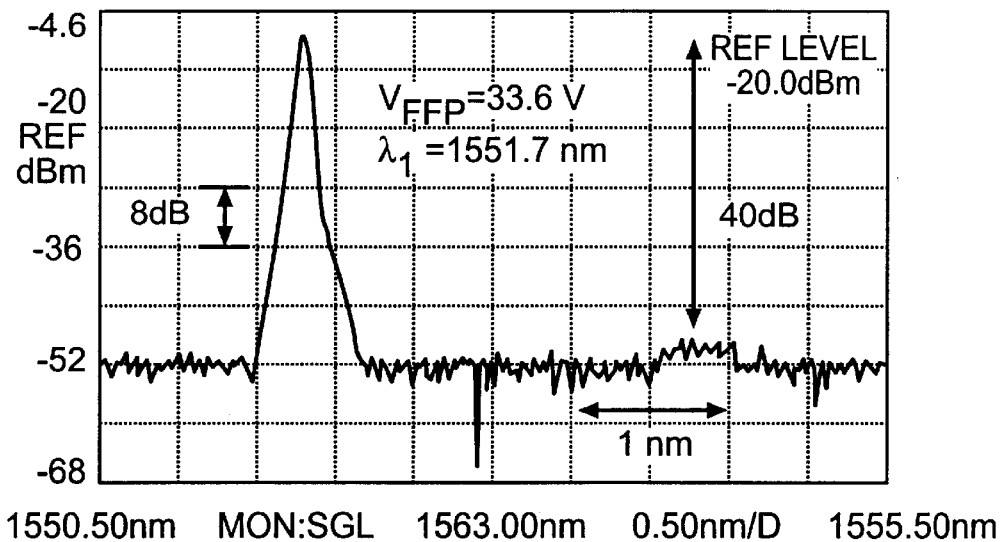
FIG. 15A shows the wavelength output of the laser configuration of FIG. 5 with 33.6 volts applied to the PZT element of the FFP.
Figure 15B:
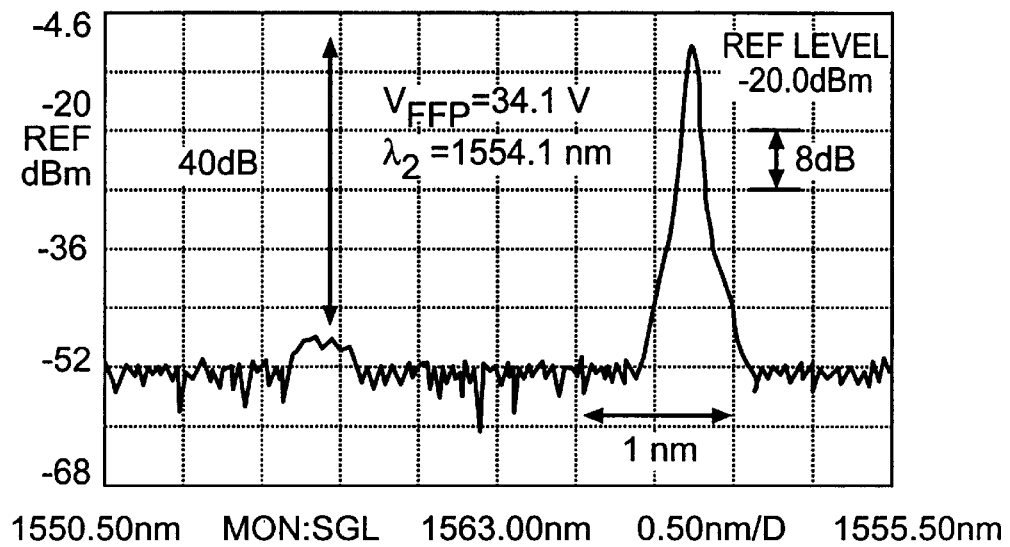
FIG. 15B shows the wavelength output of the laser configuration of FIG. 5 with 34.1 volts applied to the PZT element of the FFP.

FIGS. 15A and 15B depict the spectral data for two different voltage settings applied to a PZT element of the FFP with a spectrum range from 1550.50 nm to 1555.50 nm. Clear switching between the wavelengths corresponding to the peaks of the FBGs is observed. FIG. 15A shows that a 1551.7 nm ($\lambda_1$) signal is selected for $V_{FFP}$=33.6 V+/−0.01 V. FIG. 15B shows that the emission wavelength switched to 1554.1 nm ($\lambda_2$) when the FFP voltage 34.1 V+/−0.01 V. About 20 GHz (0.16 nm) of fine tuning, which corresponds to approximately 30 mV changes in the tunable filter voltage ($V_{FFP}$), is observed around the center wavelengths $\lambda_1$, (1551.76 nm) and $\lambda_2$ (1554.17 nm). Reflective peaks of both FBGs are centered on the ITU grid with a range of 30 dB (>99%), −25 dB, and a linewidth of 0.7 nm. For both wavelengths, output power fluctuations are less than 1% whenever one of the multiple order FFP transmission peaks is coincident with either one of the two grating reflective bands. Both channels also have side mode suppression ratios of approximately 40 dB. The FFP for both FIGS. 15A and 15B had a finesse of approximately 1000 and a FSR of approximately 5 THz.

When the FFP transmission peak is not tuned to either grating's reflective bands, i.e., FFP-unassisted emission at 1551 nm ($\lambda_1$), large output power fluctuations of approximately 50% is exhibited. This effect is caused by a combination of several factors: slight differences in reflectivity between the two gratings, the formation of an effective laser cavity defined by the gratings on one end and stray reflections from the 3 dB coupler on the other, and to the gain coefficient differential between $\lambda_1$, and $\lambda_2$, which is estimated to be as much as approximately 1 m$^{-1}$ for similar Er:Silica fibers pumped to high inversion levels.

Instrument limited linewidths of 0.05 nm are also observed. Linewidth measurements using scanning Fabry-Perot interferometry and self-homodyne techniques for similarly-configured fiber laser sources as shown in FIG. 5 are expected to yield instantaneous linewidths on the order of 1 KHz.

The switching time between $\lambda_1$, and $\lambda_2$ was measured to be approximately 25 μs based on a capacitive loading at the FFP PZT inputs. The switching time between the two wavelengths (separated by 300 GHz) is more accurately 18 μs, and may reach sub-μs speeds with the use of Bessel-function pre-filtered drivers for the FFP.

In an alternate embodiment of the present invention, the desired comb of wavelength channels may be obtained from a single sampled FBG. In addition, the accuracy of the switched wavelengths may be assured by using tighter (i.e. <10 GHz) 0.5 dB bandwidth specifications for the FBGs. Highly stabilized fixed FFPs may also be used to generate the ITU grid directly.

Additionally, the laser cavity round trip time may be further reduced by reducing laser cavity lengths to approximately 1 m by using high doping density Er/Yb:Silica fibers or semiconductor optical amplifiers. For a 16-wavelength (50 GHz channel separation) switchable source using an FFP with an optimized FSR switching speed of 5 μs, the switching time is approximately 0.75 μs.

While the above discussion has focused on the switching between two wavelengths $\lambda_1$ and $\lambda_2$ or $\lambda_a$ and $\lambda_b$, it should be appreciated that tunability from $\lambda_1$ to $\lambda_n$ is achievable by utilizing an AC input voltage having the correct frequency and magnitude.

It should be appreciated that numerous embodiments describe a fiber laser using only one fiber Fabry-Perot filter (FFP) in combination with discrete fiber Bragg gratings (FBGs). Among the advantages of using FBGs, we can list the following:

(a) Cost of FBGs: Readily available narrow linewidth FBGs are at least ten times cheaper than FFPs. In combination with high-finesse FFPs, our laser source offers price/performance advantages over prior art devices. In addition, the use of one sampled FBG instead of multiple discrete FBGs provides for the entire wavelength comb in an inexpensive manner.

(b) Wavelength stability of FBGs: Prior art devices make use of one wavelength-tunable FFP and a fixed FFP (for wavelength tunable devices), this combination makes it difficult to prevent wavelength drift from the FFPs PZT tuning assembly, consequently requiring the use of stable external "wavelength lockers." In contrast, our source inherently provides such stable wavelength filters intra-cavity through the use of fixed-wavelength fiber Bragg gratings.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A precisely and rapidly wavelength-tunable CWR pulsed laser, said laser comprising:

a gain medium;

a pump source, said pump source for providing light to said gain medium;

a laser cavity resonator, said gain medium disposed in said laser cavity resonator and said pump source optically aligned with said laser cavity resonator;

a rapidly wavelength-tunable filter disposed in said laser cavity resonator, wherein said wavelength-tunable filter is tunable by application of voltage across said wavelength-tunable filter;

a multi-wavelength grid filter disposed in said laser cavity resonator; and means for removing an output signal from said laser cavity resonator.

2. The precisely and rapidly wavelength-tunable CWR pulsed laser recited in claim 1, wherein said laser cavity resonator has a transmissive filter loop and at least a first arm; said rapidly wavelength-tunable filter disposed in said transmissive filter loop; and said multi-wavelength grid filter disposed in said first arm.

3. The precisely and rapidly wavelength-tunable CWR pulsed laser recited in claim 2, further comprising a second arm in said laser cavity resonator, and second arm coupled to said first arm and said transmissive filter loop.

4. The precisely and rapidly wavelength-tunable CWR pulsed laser recited in claim 3, further comprising a mirror disposed at an end of said second arm distal from said transmissive filter loop.

5. The precisely wavelength-tunable laser recited in claim 2, further comprising an optical coupling feedback device for combining optical feedback from said transmissive filter loop and said at least a first arm.

6. The precisely wavelength-tunable laser recited in claim 5, wherein said optical feedback coupling device is selected from the group consisting of: N-port optical circulators, fused fiber couplers, and waveguide-Y junctions.

7. The precisely wavelength-tunable laser recited in claim 5, further comprising a second arm in said laser cavity resonator, said second arm coupled to said first arm and said transmissive filter loop by said optical coupling feedback device.

8. The precisely and rapidly wavelength-tunable CWR pulsed laser recited in claim 1, wherein said multiwavelength grid filter is selected from the group consisting of Reflective Waveguide Bragg Gratings (WBGs); FBGs (Fiber Bragg Gratings); SWBG (Sampled Waveguide Bragg Gratings); SFBGs (Sampled Fiber Bragg Gratings); Transmissive WBGs; phase-shifted FBGs (with single or multiple passbands); Fabry-Perot (FP) micro-etalons and filters; fiber FP filters and micro-optic; and micromachined FP filters; semiconductor FP filters; Micro-ring resonators; waveguide couplers; Interferometric-waveguide-based filters; Michelson Interferometric (MI) waveguide filters; Mach-Zehnder Interferometric (MZI) waveguide based filters; Arrayed Waveguide Gratings (AWGs); and polarization interferometric (PI) waveguide-based filters; fiber loop mirrors; and bulk-optic -based PI filters.

9. The precisely and rapidly wavelength-tunable CWR pulsed laser recited in claim 1, wherein said rapidly wavelength-tunable filter is selected from the group consisting of tunable Reflective Waveguide Bragg Gratings (WBGs); tunable FBGs (Fiber Bragg Gratings); tunable SWBG (Sampled Waveguide Bragg Gratings); tunable SFBGs (Sampled Fiber Bragg Gratings); tunable Transmissive WBGs; phase-shifted tunable FBGs (with single or multiple passbands); tunable Fabry-Perot (FP) micro-etalons and filters; PZT-based fiber FP (FFP) filters; Liquid Crystal (LC)-based fiber FP (FFP) filters; Microelectromechanical Systems (MEMS)-based FP filters; electro-optic FP filters; current injection or optically tuned semiconductor FP filter; tunable Micro-ring resonators; tunable waveguide couplers; grating-assisted waveguide couplers and electro-optic waveguide couplers; tunable Interferometric-waveguide-based filters; tunable Michelson Interferometric (MI) waveguide filters; tunable Mach-Zehnder Interferometric (MZI) waveguide based filters; tunable Arrayed Waveguide Gratings (AWGs); and tunable polarization interferometric (PI) waveguide-based filters; fiber loop mirrors with tunable electro-optic (EO) birefringent elements; fiber loop mirrors with tunable semiconductor birefringent elements; and tunable bulk-optic -based PI filters.

10. The precisely and rapidly wavelength-tunable CWR pulsed laser recited in claim 1, wherein said gain medium is selected from the group consisting of: doped fiber optic waveguides and semiconductor optical amplifiers.

11. The precisely and rapidly wavelength-tunable CWR pulsed laser recited in claim 1, further comprising means for tuning said rapidly wavelength-tunable filter.

12. The precisely wavelength-tunable laser recited in claim 11, wherein said means for tuning said rapidly wavelength-tunable filter is selected from the group consisting of: electro-optic tuning devices, strain-tuned tuning devices and electro-absorptive tuning devices.

13. The precisely and rapidly wavelength-tunable CWR pulsed laser recited in claim 1, wherein said rapidly wavelength-tunable filter has a tuning speed of less than 50 $\mu$s.

14. The precisely and rapidly wavelength-tunable CWR pulsed laser recited in claim 1, further comprising means for tuning said rapidly wavelength-tunable filter.

15. A precisely wavelength-tunable laser, said laser comprising:
a gain medium;
a pump source, said pump source for providing light to said gain medium;
a laser cavity resonator, said gain medium disposed in said laser cavity resonator and said pump source optically aligned with said laser cavity resonator;
a rapidly wavelength-tunable filter disposed in said laser cavity resonator, wherein said wavelength-tunable filter is tunable by application of voltage across said wavelength-tunable filter;
a multi-wavelength grid filter disposed in said laser cavity, wherein said multi-wavelength grid filter is selected from the group consisting of Reflective Waveguide Bragg Gratings (WBGs); FBGs (Fiber Bragg Gratings); SWBG (Sampled Waveguide Bragg Gratings); SFBGs (Sampled Fiber Bragg Gratings); Transmissive WBGs; phase-shifted FBGs (with single or multiple passbands); Fabry-Perot (FP) micro-etalons and filters; fiber FP filters and micro-optic; and micromachined FP filters; semiconductor FP filters; Micro-ring resonators; waveguide couplers; Interferometric-waveguide-based filters; Michelson Interferometric (MI) waveguide filters; Mach-Zehnder Interferometric (MZI) waveguide based filters; Arrayed Waveguide Gratings (AWGs); and polarization interferometric (PI) waveguide-based filters; fiber loop mirrors; and bulk-optic-based PI filters; and
means for removing an output signal from said laser cavity resonator.

16. The precisely wavelength-tunable laser recited in claim 15, wherein said laser cavity resonator has a transmissive filter loop and at least a first arm; said rapidly wavelength-tunable filter disposed in said transmissive filter loop; and said multi-wavelength grid filter disposed in said first arm.

17. The precisely wavelength-tunable laser recited in claim 16, further comprising a second arm in said laser cavity resonator, and second arm coupled to said first arm and said transmissive filter loop.

18. The precisely wavelength-tunable laser recited in claim 17, further comprising a mirror disposed at an end of said second arm distal from said transmissive filter loop.

19. The precisely wavelength-tunable laser recited in claim 16, further comprising an optical coupling feedback device for combining optical feedback from said transmissive filter loop and said at least a first arm.

20. The precisely wavelength-tunable laser recited in claim 19, wherein said optical coupling feedback device is selected from the group consisting of: N-port optical circulators, fiber fused couplers, and waveguide-Y junctions.

21. The precisely wavelength-tunable laser recited in claim 19, further comprising a second arm in said laser cavity resonator, said second arm coupled to said first arm and said transmissive filter loop by said optical coupling feedback device.

22. The precisely wavelength-tunable laser recited in claim 15, wherein said rapidly wavelength-tunable filter is selected from the group consisting of tunable Reflective Waveguide Bragg Gratings (WBGs); tunable FBGs (Fiber Bragg Gratings); tunable SWBG (Sampled Waveguide Bragg Gratings); tunable SFBGs (Sampled Fiber Bragg Gratings); tunable Transmissive WBGs; phase-shifted tunable FBGs (with single or multiple passbands); tunable Fabry-Perot (FP) micro-etalons and filters; PZT-based fiber FP (FFP) filters; Liquid Crystal (LC)-based fiber FP (FFP) filters; Microelectromechanical Systems (MEMS)-based FP filters; electro-optic FP filters; current injection or optically tuned semiconductor FP filter; tunable Micro-ring resonators; tunable waveguide couplers; grating-assisted waveguide couplers and electro-optic waveguide couplers; tunable Interferometric-waveguide-based filters; tunable Michelson Interferometric (MI) waveguide filters; tunable Mach-Zehnder Interferometric (MZI) waveguide based filters; tunable Arrayed Waveguide Gratings (AWGs); and tunable polarization interferometric (PI) waveguide-based filters; fiber loop mirrors with tunable electro-optic (EO) birefringent elements; fiber loop mirrors with tunable semiconductor birefringent elements; and tunable bulk-optic-based PI filters.

23. The precisely wavelength-tunable laser recited in claim 15, wherein said gain medium is selected from the group consisting of: doped fiber optic waveguides and semiconductor optical amplifiers.

24. The precisely wavelength-tunable laser recited in claim 15, further comprising means for tuning said rapidly wavelength-tunable filter.

25. The precisely wavelength-tunable laser recited in claim 24, wherein said means for tuning said rapidly wavelength-tunable filter is selected from the group consisting of: electro-optic tuning devices, strain-tuned tuning devices and electro-absorptive tuning devices.

26. The precisely wavelength-tunable narrow linewidth laser recited in claim 15, wherein said rapidly wavelength-tunable filter has a tuning speed of less than 50 $\mu$s.

27. A precisely wavelength-tunable laser, said laser comprising:
 a gain medium;
 a pump source, said pump source for providing light to said gain medium;
 a laser cavity resonator, said gain medium disposed in said laser cavity resonator and said pump source optically aligned with said laser cavity resonator;
 a rapidly wavelength-tunable filter disposed in said laser cavity resonator, wherein said wavelength-tunable filter is tunable by application of voltage across said wavelength-tunable filter;
 a multi-wavelength grid filter disposed in said laser cavity resonator; and
 means for removing an output signal from said laser cavity resonator, wherein said laser cavity resonator has a gain loop and at least a first arm and a second arm attached to said gain loop; said rapidly wavelength-tunable filter disposed in said first arm; and said multi-wavelength grid filter disposed in said second arm.

28. The precisely wavelength-tunable laser recited in claim 27, wherein said multiwavelength grid filter is selected from the group consisting of Reflective Waveguide Bragg Gratings (WBGs); FBGs (Fiber Bragg Gratings); SWBG (Sampled Waveguide Bragg Gratings); SFBGs (Sampled Fiber Bragg Gratings); Transmissive WBGs; phase-shifted FBGs (with single or multiple passbands); Fabry-Perot (FP) micro-etalons and filters; fiber FP filters and micro-optic; and micromachined FP filters; semiconductor FP filters; Micro-ring resonators; waveguide couplers; Interferometric-waveguide-based filters; Michelson Interferometric (MI) waveguide filters; Mach-Zehnder Interferometric (MZI) waveguide based filters; Arrayed Waveguide Gratings (AWGs); and polarization interferometric (PI) waveguide-based filters; fiber loop mirrors; and bulk-optic -based PI filters.

29. The precisely wavelength-tunable laser recited in claim 27, wherein said rapidly wavelength-tunable filter is selected from the group consisting of tunable Reflective Waveguide Bragg Gratings (WBGs); tunable FBGs (Fiber Bragg Gratings); tunable SWBG (Sampled Waveguide Bragg Gratings); tunable SFBGs (Sampled Fiber Bragg Gratings); tunable Transmissive WBGs; phase-shifted tunable FBGs (with single or multiple passbands); tunable Fabry-Perot (FP) micro-etalons and filters; PZT-based fiber FP (FFP) filters; Liquid Crystal (LC)-based fiber FP (FFP) filters; Microelectromechanical Systems (MEMS)-based FP filters; electro-optic FP filters; current injection or optically tuned semiconductor FP filter; tunable Micro-ring resonators; tunable waveguide couplers; grating-assisted waveguide couplers and electro-optic waveguide couplers; tunable Interferometric-waveguide-based filters; tunable Michelson Interferometric (MI) waveguide filters; tunable Mach-Zehnder Interferometric (MZI) waveguide based filters; tunable Arrayed Waveguide Gratings (AWGs); and tunable polarization interferometric (PI) waveguide-based filters; fiber loop mirrors with tunable electro-optic (EO) birefringent elements; fiber loop mirrors with tunable semiconductor birefringent elements; and tunable bulk-optic-based PI filters.

30. The precisely wavelength-tunable laser recited in claim 27, wherein said gain medium is selected from the group consisting of: doped fiber optic waveguides and semiconductor optical amplifiers.

31. The precisely wavelength-tunable laser recited in claim 27, further comprising means for tuning said rapidly wavelength-tunable filter.

32. The precisely wavelength-tunable laser recited in claim 31, wherein said means for tuning said rapidly wavelength-tunable filter is selected from the group consisting of: electro-optic tuning devices, strain-tuned tuning devices and electro-absorptive tuning devices.

33. The precisely wavelength-tunable laser recited in claim 27, wherein said rapidly wavelength-tunable filter has a tuning speed of less than 50 $\mu$s.

34. The precisely wavelength-tunable laser recited in claim 27, further comprising an optical coupling feedback device for combining optical feedback from said transmissive filter loop and said at least a first arm.

35. The precisely wavelength-tunable laser recited in claim 34, wherein said optical coupling feedback device is selected from the group consisting of: N-port optical circulators, fiber fused couplers, and waveguide-Y junctions.

36. A precisely wavelength-tunable laser, said laser comprising:
 a gain medium;
 a pump source, said pump source providing light to said gain medium;
 a first laser cavity resonator, said pump source optically aligned with said first laser cavity resonator;
 a second laser cavity resonator, said gain medium disposed in either said first laser cavity resonator or said second laser cavity resonator;
 an optical coupling feedback device for combining optical feedback from said first and second laser cavity resonators;
 a rapidly wavelength-tunable filter disposed in said first laser cavity resonator, wherein said wavelength-tunable filter is tunable by application of voltage across said wavelength-tunable filter;

a multi-wavelength grid filter disposed in said second laser cavity resonator; and means for removing an output signal from one of said laser cavity resonators.

37. The precisely wavelength-tunable laser recited in claim 36, wherein said multi-wavelength grid filter is selected from the group consisting of Reflective Waveguide Bragg Gratings (WBGs); FBGs (Fiber Bragg Gratings); SWBG (Sampled Waveguide Bragg Gratings); SFBGs (Sampled Fiber Bragg Gratings); Transmissive WBGs; phase-shifted FBGs (with single or multiple passbands); Fabry-Perot (FP) micro-etalons and filters; fiber FP filters and micro-optic; and micromachined FP filters; semiconductor FP filters; Micro-ring resonators; waveguide couplers; Interferometric-waveguide-based filters; Michelson Interferometric (MI) waveguide filters; Mach-Zehnder Interferometric (MZI) waveguide based filters; Arrayed Waveguide Gratings (AWGs); and polarization interferometric (PI) waveguide-based filters; fiber loop mirrors; and bulk-optic-based PI filters.

38. The precisely wavelength-tunable laser recited in claim 36, wherein said rapidly wavelength-tunable filter is selected from the group consisting of tunable Reflective Waveguide Bragg Gratings (WBGs); tunable FBGs (Fiber Bragg Gratings); tunable SWBG (Sampled Waveguide Bragg Gratings); tunable SFBGs (Sampled Fiber Bragg Gratings); tunable Transmissive WBGs; phase-shifted tunable FBGs (with single or multiple passbands); tunable Fabry-Perot (FP) micro-etalons and filters; PZT-based fiber FP (FFP) filters; Liquid Crystal (LC)-based fiber FP (FFP) filters; Microelectromechanical Systems (MEMS)-based FP filters; electro-optic FP filters; current injection or optically tuned semiconductor FP filter; tunable Micro-ring resonators; tunable waveguide couplers; grating-assisted waveguide couplers and electro-optic waveguide couplers; tunable Interferometric-waveguide-based filters; tunable Michelson Interferometric (MI) waveguide filters; tunable Mach-Zehnder Interferometric (MZI) waveguide based filters; tunable Arrayed Waveguide Gratings (AWGs); and tunable polarization interferometric (PI) waveguide-based filters; fiber loop mirrors with tunable electro-optic (EO) birefringent elements; fiber loop mirrors with tunable semiconductor birefringent elements; and tunable bulk-optic-based PI filters.

39. The precisely wavelength-tunable laser recited in claim 36, wherein said gain medium is selected from the group consisting of: doped fiber optic waveguides and semiconductor optical amplifiers.

40. The precisely wavelength-tunable laser recited in claim 36, wherein said rapidly wavelength-tunable filter has a tuning speed of less than 50 $\mu$s.

41. The precisely wavelength-tunable laser recited in claim 36, wherein said optical feedback coupling device is selected from the group consisting of: N-port optical circulators, fused fiber couplers, and waveguide-Y junctions.

42. A precisely wavelength tunable laser, said laser comprising:

a gain medium;

a pump source, said pump source providing light to said gain medium;

a laser cavity resonator, said gain medium disposed in said laser cavity resonator and said pump source optically aligned with said laser cavity resonator;

a rapidly wavelength-tunable filter disposed in said laser cavity resonator, wherein said wavelength-tunable filter is tunable by application of voltage across said wavelength-tunable filter;

a multi-wavelength grid filter disposed in said laser cavity resonator;

a coupling means; and means for removing an output signal from said laser cavity resonator;

wherein said laser cavity resonator has a transmissive filter loop and at least a first arm; said rapidly wavelength-tunable filter disposed in said transmissive filter loop; and said multi-wavelength grid filter disposed in said first arm, said transmissive filter loop coupled by said coupling means to said first arm.

43. The precisely wavelength tunable laser recited in claim 42, wherein said multi-wavelength grid filter is selected from the group consisting of Reflective Waveguide Bragg Gratings (WBGs); FBGs (Fiber Bragg Gratings); SWBG (Sampled Waveguide Bragg Gratings); SFBGs (Sampled Fiber Bragg Gratings); Transmissive WBGs; phase-shifted FBGs (with single or multiple passbands); Fabry-Perot (FP) micro-etalons and filters; fiber FP filters and micro-optic; and micromachined FP filters; semiconductor FP filters; Micro-ring resonators; waveguide couplers; Interferometric-waveguide-based filters; Michelson Interferometric (MI) waveguide filters; Mach-Zehnder Interferometric (MZI) waveguide based filters; Arrayed Waveguide Gratings (AWGs); and polarization interferometric (PI) waveguide-based filters; fiber loop mirrors; and bulk-optic-based PI filters.

44. The precisely wavelength tunable laser recited in claim 42, wherein said rapidly wavelength-tunable filter is selected from the group consisting of tunable Reflective Waveguide Bragg Gratings (WBGs); tunable FBGs (Fiber Bragg Gratings); tunable SWBG (Sampled Waveguide Bragg Gratings); tunable SFBGs (Sampled Fiber Bragg Gratings); tunable Transmissive WBGs; phase-shifted tunable FBGs (with single or multiple passbands); tunable Fabry-Perot (FP) micro-etalons and filters; PZT-based fiber FP (FFP) filters; Liquid Crystal (LC)-based fiber FP (FFP) filters; Microelectromechanical Systems (MEMS)-based FP filters; electro-optic FP filters; current injection or optically tuned semiconductor FP filter; tunable Micro-ring resonators; tunable waveguide couplers; grating-assisted waveguide couplers and electro-optic waveguide couplers; tunable Interferometric-waveguide-based filters; tunable Michelson Interferometric (MI) waveguide filters; tunable Mach-Zehnder Interferometric (MZI) waveguide based filters; tunable Arrayed Waveguide Gratings (AWGs); and tunable polarization interferometric (PI) waveguide-based filters; fiber loop mirrors with tunable electro-optic (EO) birefringent elements; fiber loop mirrors with tunable semiconductor birefringent elements; and tunable bulk-optic-based PI filters.

45. The precisely wavelength tunable laser recited in claim 42, wherein said gain medium is selected from the group consisting of: doped fiber optic waveguides and semiconductor optical amplifiers.

46. The precisely wavelength tunable laser recited in claim 42, further comprising means for tuning said rapidly wavelength-tunable filter.

47. The precisely wavelength-tunable laser recited in claim 42, further comprising a second arm in said laser cavity resonator, and second arm coupled to said first arm and said transmissive filter loop by said coupling means.

48. The precisely wavelength-tunable laser recited in claim 47, further comprising a mirror disposed at an end of said second arm distal from said transmissive filter loop.

49. The precisely wavelength-tunable laser recited in claim 42, wherein said rapidly wavelength-tunable filter has a tuning speed of less than 50 $\mu$s.

* * * * *